(12) United States Patent
Mitsuiki et al.

(10) Patent No.: US 9,589,954 B2
(45) Date of Patent: Mar. 7, 2017

(54) SEMICONDUCTOR DEVICE HAVING RECESS FILLED WITH INSULATING MATERIAL PROVIDED BETWEEN SOURCE/DRAIN IMPURITY REGION AND GATE INSULATOR

(71) Applicant: Renesas Electronics Corporation, Tokyo (JP)

(72) Inventors: Akira Mitsuiki, Tokyo (JP); Tomoo Nakayama, Ibaraki (JP); Shigeaki Shimizu, Ibaraki (JP); Hiroyuki Okuaki, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/818,516

(22) Filed: Aug. 5, 2015

(65) Prior Publication Data
US 2016/0056233 A1 Feb. 25, 2016

(30) Foreign Application Priority Data

Aug. 21, 2014 (JP) ................................. 2014-168213

(51) Int. Cl.
*H01L 27/088* (2006.01)
*H01L 29/78* (2006.01)
(Continued)

(52) U.S. Cl.
CPC ...... *H01L 27/088* (2013.01); *H01L 21/31111* (2013.01); *H01L 21/32* (2013.01); *H01L 21/76232* (2013.01); *H01L 21/823418* (2013.01); *H01L 21/823456* (2013.01); *H01L 29/0653* (2013.01); *H01L 29/41775* (2013.01); *H01L 29/42368* (2013.01); *H01L 29/42376* (2013.01); *H01L 29/7833* (2013.01); *H01L 29/7835* (2013.01)

(58) Field of Classification Search
CPC ............ H01L 21/31111; H01L 21/308; H01L 21/3081; H01L 21/32; H01L 21/76232; H01L 21/823418; H01L 21/823462; H01L 21/823481; H01L 27/088; H01L 29/0653; H01L 29/41775; H01L 29/42368; H01L 29/7833; H01L 29/7835
See application file for complete search history.

(56) References Cited

U.S. PATENT DOCUMENTS 7,071,076 B2 7/2006 Liu
7,122,876 B2 * 10/2006 Wu ........................ H01L 21/74
257/374
(Continued)

FOREIGN PATENT DOCUMENTS

JP 2005-19703 A 1/2005

*Primary Examiner* — Stephen W Smoot
(74) *Attorney, Agent, or Firm* — Sughrue Mion, PLLC

(57) ABSTRACT

Electric-field concentration in the vicinity of a recess is suppressed. A gate insulating film is provided on a substrate that has a drain region and a first recess therein. The first recess is located between the gate insulating film and the drain region, and is filled with an insulating film. The insulating film has a second recess on its side close to the gate insulating film. An angle defined by an inner side face of the first recess and the surface of the substrate is rounded on a side of the drain region close to the gate insulating film.

4 Claims, 33 Drawing Sheets

(51) Int. Cl.
*H01L 21/762* (2006.01)
*H01L 21/32* (2006.01)
*H01L 21/311* (2006.01)
*H01L 29/417* (2006.01)
*H01L 29/423* (2006.01)
*H01L 29/06* (2006.01)
*H01L 21/8234* (2006.01)

(56) References Cited

U.S. PATENT DOCUMENTS

| | | | | |
|---|---|---|---|---|
| 8,174,071 B2 * | 5/2012 | Tien | ............... | H01L 29/4236 257/343 |
| 2004/0251492 A1 * | 12/2004 | Lin | ............... | H01L 29/7816 257/335 |
| 2009/0166736 A1 * | 7/2009 | Park | ............... | H01L 29/4236 257/343 |
| 2015/0249126 A1 * | 9/2015 | Kataoka | ............ | H01L 29/66659 257/343 |

* cited by examiner

SEMICONDUCTOR DEVICE HAVING RECESS FILLED WITH INSULATING MATERIAL PROVIDED BETWEEN SOURCE/DRAIN IMPURITY REGION AND GATE INSULATOR

CROSS-REFERENCE TO RELATED APPLICATIONS

The disclosure of Japanese Patent Application No. 2014-168213 filed on Aug. 21, 2014 including the specification, drawings and abstract is incorporated herein by reference in its entirety.

BACKGROUND

The present invention relates to a semiconductor device and a method of manufacturing the semiconductor device. For example, the invention is a technology applicable to a power transistor.

In some semiconductor device, a plurality of transistors are provided on a semiconductor substrate. In such a case, the transistors may be electrically isolated from one another using shallow trench isolation (STI).

Japanese Unexamined Patent Application Publication No. 2005-19703 (JP-A-2005-19703) describes an exemplary STI. In JP-A-2005-19703, first, a recess is formed on a surface of a silicon substrate. Subsequently, the recess is filled with an insulating film. Subsequently, the surface of the silicon substrate is etched. This allows the top of the insulating film to be located above the surface of the silicon substrate. Subsequently, an oxide film is formed on the surface of the silicon substrate by thermal oxidation. Subsequently, the oxide film is removed. Subsequently, a gate insulating film is formed on the surface of the silicon substrate by thermal oxidation. JP-A-2005-19703 describes that oxygen concentration is higher in the vicinity of the insulating film (recess) than in another region. JP-A-2005-19703 further describes that the gate insulating film has a larger thickness in the vicinity of the recess than in another region.

SUMMARY

A gate electrode and a gate insulating film may be provided in the vicinity of the recess provided for STI. Furthermore, a high voltage may be applied to the vicinity of the recess. In such a case, it is necessary to suppress electric-field concentration in the vicinity of the recess. Other issues and novel features will be clarified from the description of this specification and the accompanying drawings.

According to one embodiment of the invention, there is provided a semiconductor device including a substrate and a first transistor. The first transistor includes a gate insulating film. The transistor further includes a first impurity region that is to be one of a drain and a source. The substrate has a first recess therein. The first recess is located between the gate insulating film and the first impurity region. A first angle defined by an inner side face of the first recess and the surface of the substrate is rounded on a side of the first recess close to the gate insulating film.

According to the one embodiment, electric-field concentration in the vicinity of the recess is suppressed.

DETAILED DESCRIPTION

Hereinafter, some embodiments of the invention are described with reference to the accompanying drawings. In all the drawings, like components are designated by like numerals, and duplicated description is appropriately omitted.

First Embodiment

Figure 1:
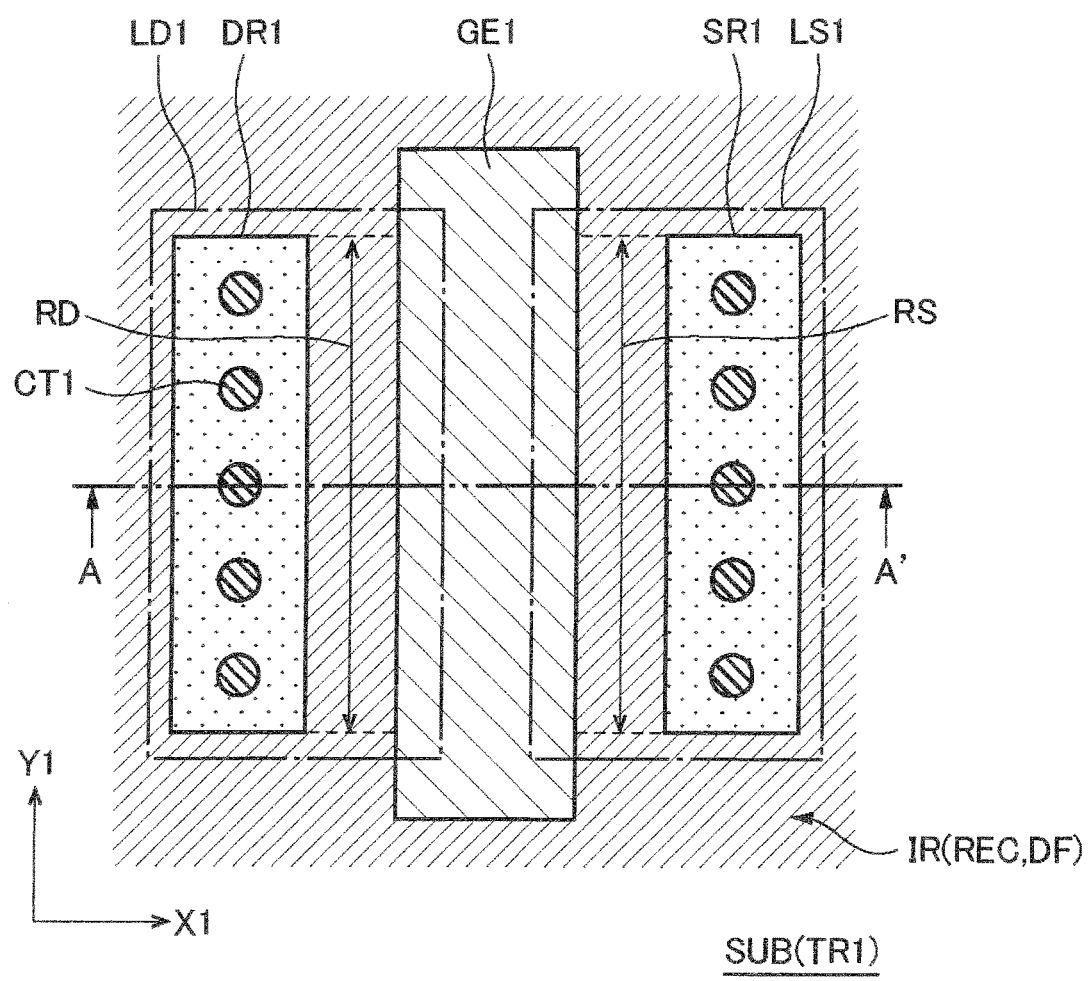
FIG. 1 is a plan view illustrating a configuration of a transistor for use in a semiconductor device according to a first embodiment.
Figure 2:
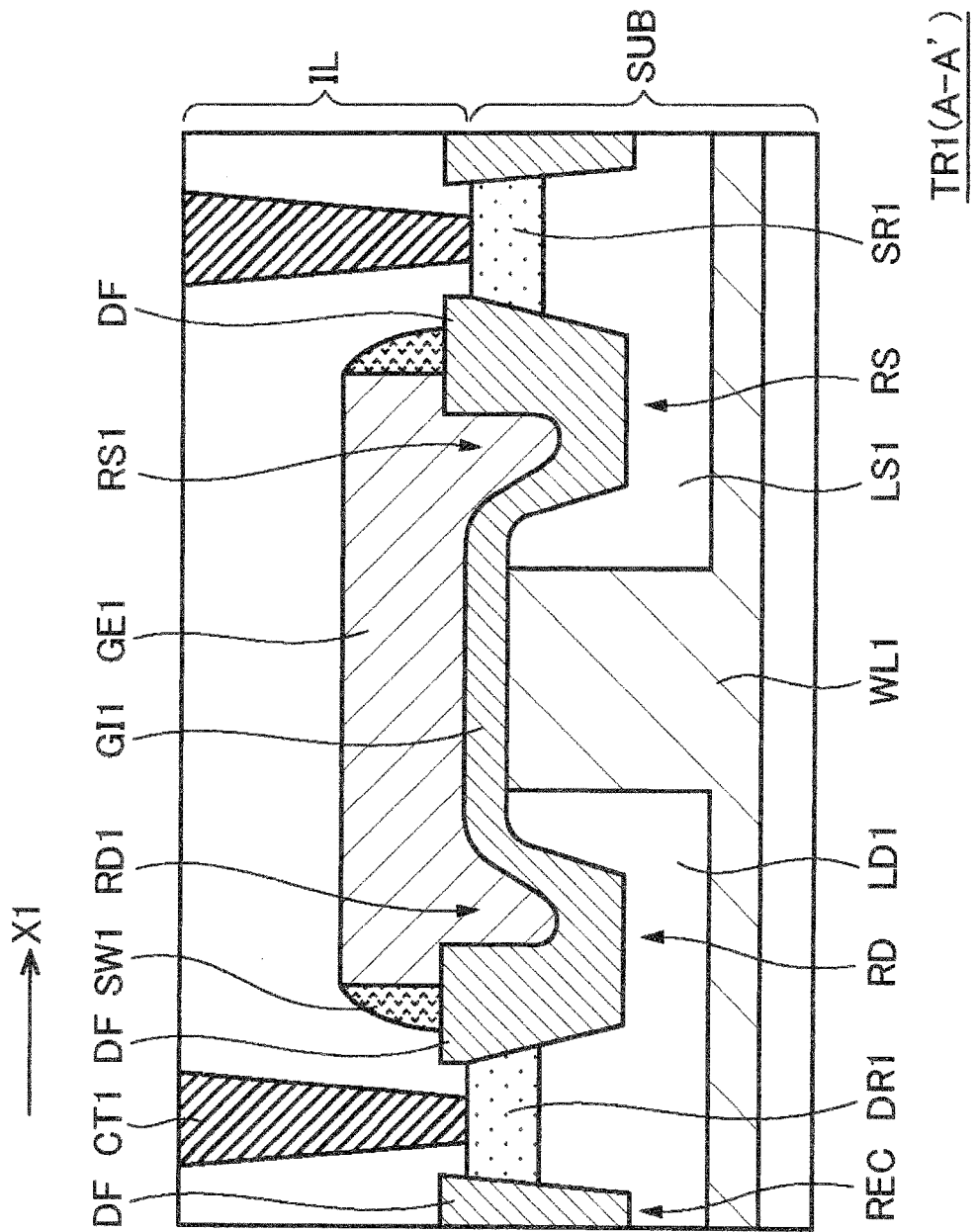
FIG. 2 is a sectional view along A-A' in FIG. 1.

FIG. 1 is a plan view illustrating a configuration of a transistor TR1 for use in a semiconductor device according to a first embodiment. FIG. 2 is a sectional view along A-A' in FIG. 1. As illustrated in FIG. 2, the transistor TR1 is formed using a substrate SUB. Specifically, the substrate SUB has a well WL1. The transistor TR1 is formed using the well WL1. As illustrated in FIG. 2, the transistor TR1 includes a gate electrode GE1, a gate insulating film GI1, a drain region DR1 (first impurity region), a source region SR1 (second impurity region), a lightly-doped drain (LDD) region LD1, a lightly-doped source (LDS) region LS1, and a sidewall SW1.

A planar layout of the transistor TR1 is described with reference to FIG. 1. In the transistor TR1, a drain (the drain region DR1), the gate electrode GE1, and a source (the source region SR1) are arranged in this order in a first direction (X1 direction). Each of the drain region DR1, the gate electrode GE1, and the source region SR1 extends in a second direction (Y1 direction) perpendicular to the first direction (X1 direction).

The substrate SUB has an isolation region IR. As described in detail later with reference to FIG. 2, the isolation region IR is configured of an insulating film DF (FIG. 2) filled in a recess REC (FIG. 2) of the substrate SUB. In other words, the isolation region IR is formed by STI. As illustrated in FIG. 1, each of the drain region DR1 and the source region SR1 is enclosed by the isolation region IR in a plan view. In this configuration, as described in detail later with reference to FIG. 2, a recess RD (an isolation region IR) is provided between the drain region DR1 and the gate electrode GE1. Likewise, a recess RS (an isolation region IR) is provided between the source region SR1 and the gate electrode GE1.

As illustrated in FIG. 1, the drain region DR1 has a plurality of contacts CT1. The contacts CT1 are arranged in the second direction (Y1 direction). The source region SR1 also has a plurality of contacts CT1. Such contacts CT1 are also arranged in the second direction (Y1 direction).

As illustrated in FIG. 1, the LDD region LD1 internally includes the drain region DR1 in a plan view. Likewise, the LDS region LS1 internally includes the source region SR1 in a plan view. In addition, a side face of the LDD region LD1 on a side near the source region SR1 is within the gate electrode GE1 in a plan view. Likewise, a side face of the LDS region LS1 on a side near the drain region DR1 is within the gate electrode GE1 in a plan view.

A sectional structure of the transistor TR1 is now described with reference to FIG. 2. As illustrated in FIG. 2, the well WL1 has the LDD region LD1 and the LDS region LS1. The LDD region LD1 has the drain region DR1 therein. The LDS region LS1 has the source region SR1 therein. The gate insulating film GI1 is provided between the LDD region LD1 and the LDS region LS1. The recess RD (a first recess) is located between the drain region DR1 and the gate insulating film GI1. The recess RS (a third recess) is located between the source region SR1 and the gate insulating film GI1.

Each of the LDD region LD1 and the LDS region LS1 has a conductivity type opposite to that of the well WL1. The drain region DR1 is shallower than the LDD region LD1, and has an impurity concentration higher than that of the LDD region LD1. Likewise, the source region SR1 is shallower than the LDS region LS1, and has an impurity concentration higher than that of the LDS region LS1.

The recess RD is filled with the insulating film DF (a first insulating film). Likewise, the recess RS is filled with the insulating film DF (a second insulating film). The insulating film DF is, for example, a silicon oxide film. In the exemplary case illustrated in FIG. 2, the insulating film DF in the recess RD and the insulating film DF in the recess RS are integral with the gate insulating film GI1. The insulating film DF in the recess RD has a recess RD1 (second recess) in its region on a side close to the gate insulating film GI1. Likewise, the insulating film DF in the recess RS has a recess RS1 (fourth recess) in its region on a side close to the gate insulating film GI1. Each of the recess RD1 and the recess RS1 is filled with part of the gate electrode GE1.

The gate electrode GE1 is located over the substrate SUB. Furthermore, the sidewall SW1 is provided on each side face of the gate electrode GE1. The gate electrode GE1 is formed of polysilicon, for example. The sidewall SW1 is formed of a silicon oxide film or a silicon nitride film, for example.

The transistor TR1 is covered with an insulating layer IL. The contacts CT1 are buried in the insulating layer IL. Each contact CT1 on a side close to the drain region DR1 is coupled to the drain region DR1. Each contact CT1 on a side close to the source region SR1 is coupled to the source region SR1.

Figure 3A:
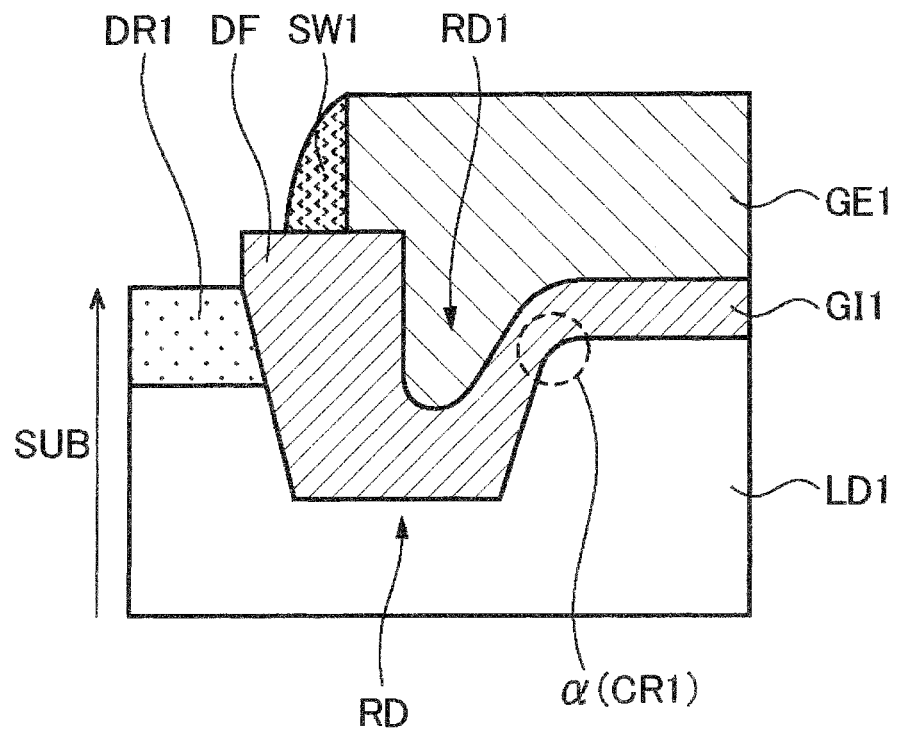
FIGS. 3A and 3B are each an enlarged view of a recess illustrated in FIG. 2.
Figure 3B:
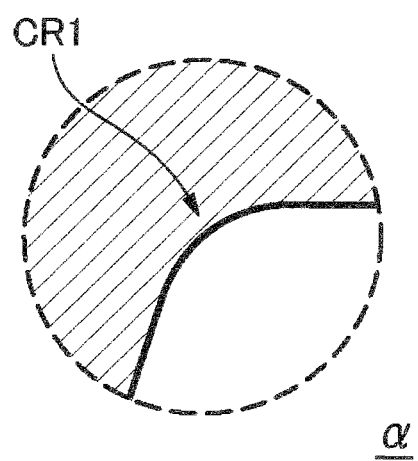

FIG. 3A is an enlarged view of the recess RD illustrated in FIG. 2. FIG. 3B is an enlarged view of a portion α in FIG.

3A. As illustrated in FIG. 3A, an angle (angle CR1) defined by an inner side face of the recess RD and the surface of the substrate SUB is located on a side of the recess RD close to the gate insulating film GI1. As illustrated in FIG. 3B, the angle CR1 is rounded. Electric-field concentration at the angle CR1 is thus suppressed.

In detail, as illustrated in FIG. 3A, the surface of the substrate SUB is located on one straight line (a first straight line) except for the angle CR1. Likewise, the inner side face of the recess RD on the side close to the gate insulating film GI1 is located on one straight line (a second straight line) except for the angle CR1. In such a case, the angle CR1 is located inside an angle defined by the first straight line and the second straight line. The angle defined by the first straight line and the second straight line is, for example, 90 to 120 degrees.

Furthermore, as illustrated in FIG. 3A, the gate insulating film GI1 is integral with the insulating film DF. The insulating film configuring the gate insulating film GI1 and the insulating film DF is provided along the angle CR1 on the side of the recess RD close to the gate insulating film GI1. In this way, the insulating film is partially provided along the angle CR1 on the inner side face of the recess RD1.

The depth of the recess RD (in FIG. 3A, a distance between the top of the drain region DR1 and the bottom of the recess RD in a thickness direction of the substrate SUB) is, for example, 200 to 400 nm. Furthermore, the angle defined by the first straight line (straight line along the surface of the substrate SUB) and the second straight line (straight line along the inner side face of the recess RD) is, for example, 90 to 120 degrees as described above. When the depth of the recess RD and the angle are each as described above, the angle CR1 is rounded such that the minimum of the radius of curvature is, for example, 10 to 200 nm.

Figure 4A:
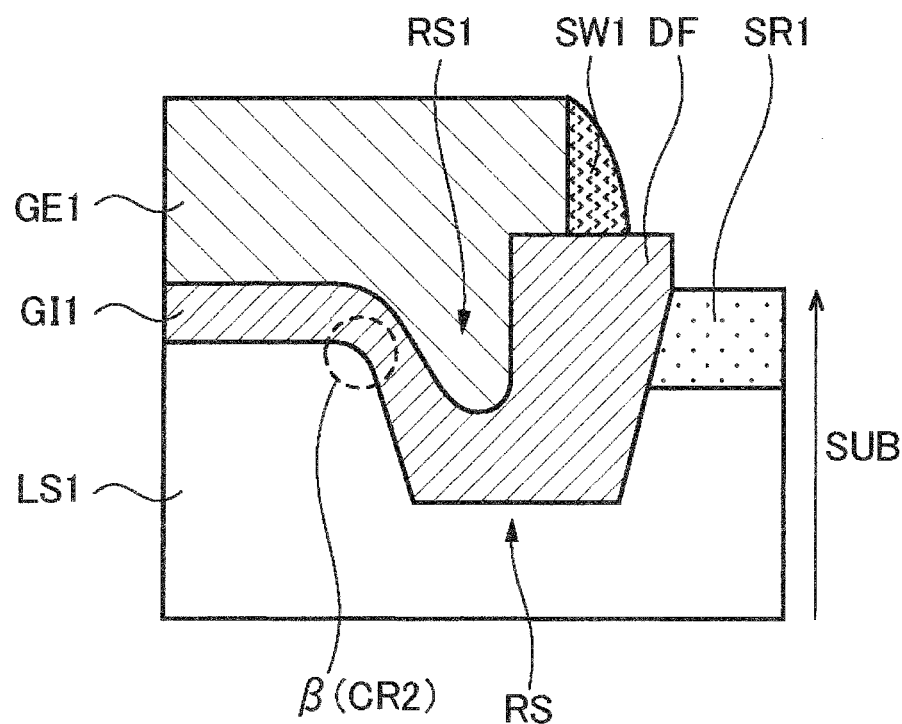
FIGS. 4A and 4B are each an enlarged view of another recess illustrated in FIG. 2.
Figure 4B:
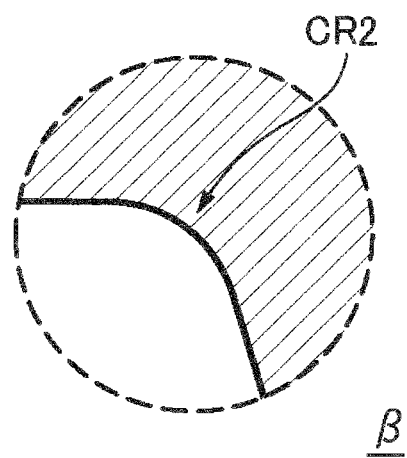

FIG. 4A is an enlarged view of the recess RS illustrated in FIG. 2. FIG. 4B is an enlarged view of a portion β in FIG. 4A. As illustrated in FIG. 4A, an angle (angle CR2) defined by an inner side face of the recess RS and the surface of the substrate SUB is located on a side of the recess RS close to the gate insulating film GI1. As illustrated in FIG. 4B, the angle CR2 is rounded. Electric-field concentration at the angle CR2 is thus suppressed.

In detail, as illustrated in FIG. 4A, the surface of the substrate SUB is located on one straight line (a third straight line) except for the angle CR2. Likewise, the inner side face of the recess RS on the side close to the gate insulating film GI1 is located on one straight line (a fourth straight line) except for the angle CR2. In such a case, the angle CR2 is located inside an angle defined by the third straight line and the fourth straight line. The angle defined by the third straight line and the fourth straight line is, for example, 90 to 120 degrees.

Furthermore, as illustrated in FIG. 4A, the gate insulating film GI1 is integral with the insulating film DF. The insulating film configuring the gate insulating film GI1 and the insulating film DF is provided along the angle CR2 on the side of the recess RS close to the gate insulating film GI1. In this way, the insulating film is partially provided along the angle CR2 on the inner side face of the recess RS1.

The depth of the recess RS (in FIG. 4A, a distance between the top of the source region SR1 and the bottom of the recess RS in the thickness direction of the substrate SUB) is, for example, 200 to 400 nm. Furthermore, the angle defined by the third straight line (straight line along the surface of the substrate SUB) and the fourth straight line (straight line along the inner side face of the recess RS) is, for example, 90 to 120 degrees as described above. When the depth of the recess RS and the angle are each as described above, the angle CR2 is rounded such that the minimum of the radius of curvature is, for example, 10 to 200 nm.

Figure 5:
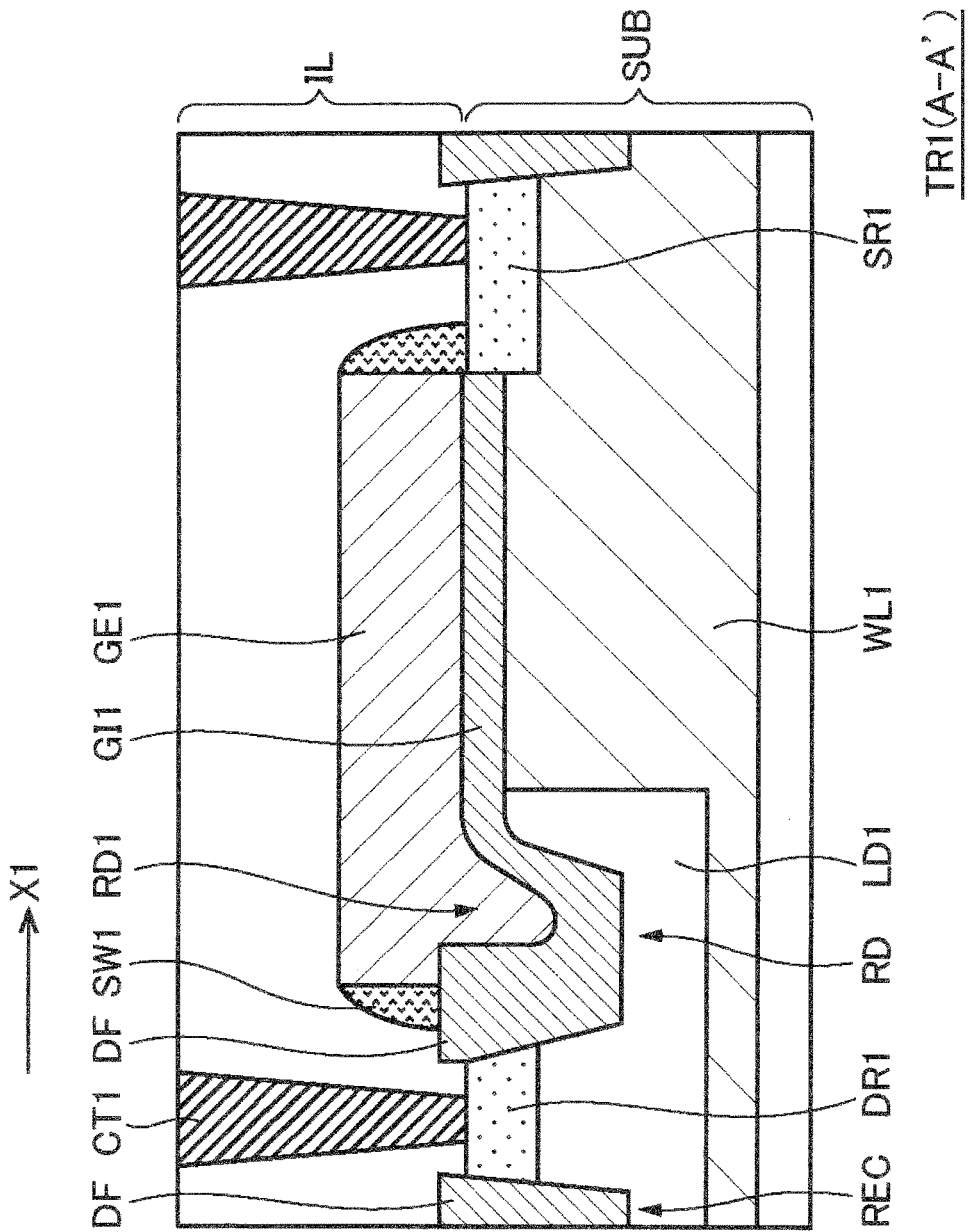
FIG. 5 illustrates a modification of FIG. 2.

FIG. 5 illustrates a modification of FIG. 2. In some case, a portion between the source region SR1 and the well WL1 is not required to have high withstand voltage. In such a case, as illustrated in FIG. 5, the LDS region LS1 (FIG. 2) and the recess RS (FIG. 2) may not be provided. In the exemplary case illustrated in FIG. 5, an end of the gate insulating film GI1 on a side close to the drain region DR1 reaches the drain region DR1.

FIGS. 6 to 14 are sectional views illustrating a method of manufacturing the semiconductor device illustrated in FIGS. 3A and 3B. First, as illustrated in FIG. 2, the well WL1 is formed in the substrate SUB. Subsequently, the LDD region LD1 and the LDS region LS1 are formed in the well WL1.

Figure 6:
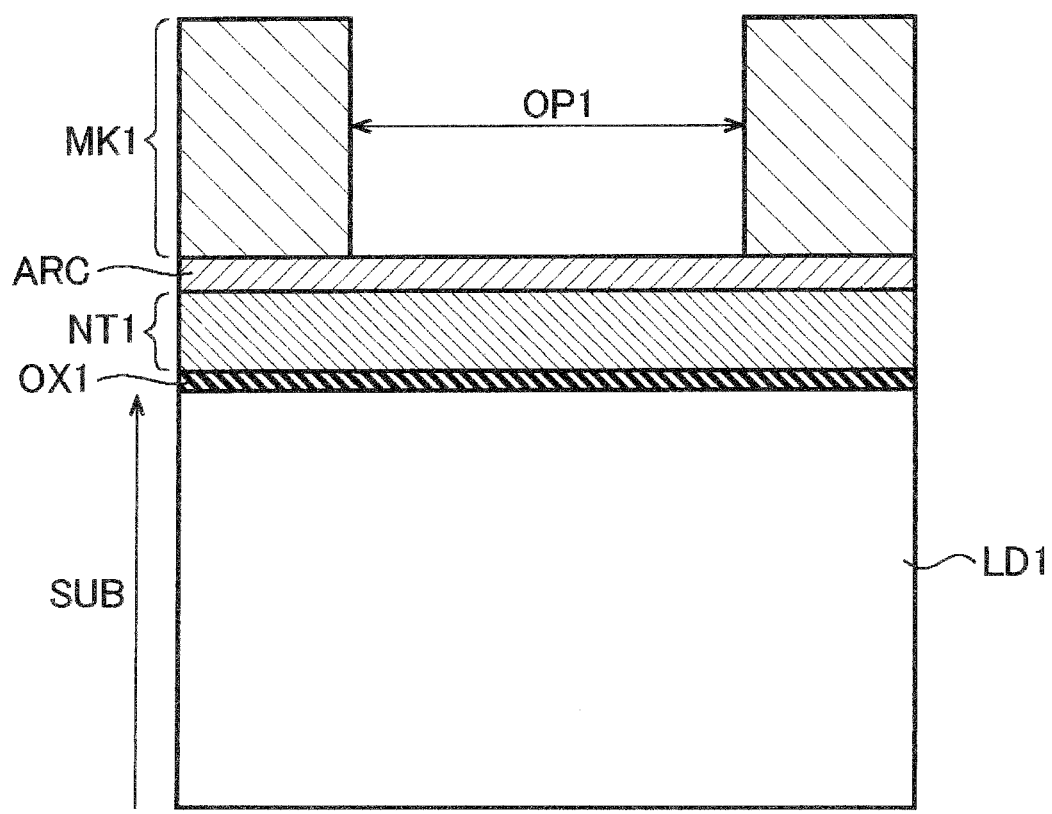
FIG. 6 is a sectional view illustrating a method of manufacturing the semiconductor device illustrated in FIG. 3.

Subsequently, as illustrated in FIG. 6, an oxide film OX1 (for example, a silicon oxide film), a nitride film NT1 (for example, a silicon nitride film) (the first insulating film), an antireflection coating ARC, and a mask film MK1 are stacked in this order on the substrate SUB. Subsequently, an opening OP1 is formed in the mask film MK1 by lithography.

Figure 7:
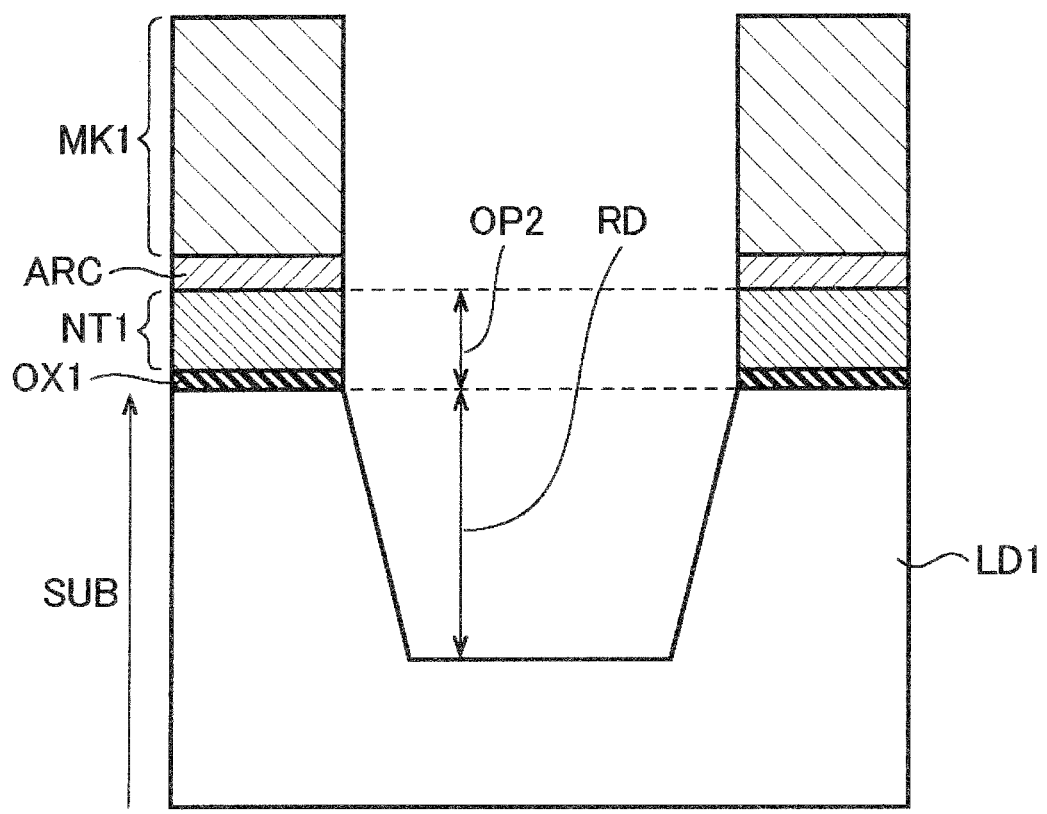
FIG. 7 is a sectional view illustrating the method of manufacturing the semiconductor device illustrated in FIG. 3.

Subsequently, as illustrated in FIG. 7, the nitride film NT1, the oxide film OX1, and the substrate SUB are etched with the mask film MK1 as a mask. An opening OP2 is thus formed through the nitride film NT1 and the oxide film OX1. Furthermore, the recess RD is formed in the substrate SUB through the opening OP2. Subsequently, the mask film MK1 and the antireflection coating ARC are removed.

Figure 8:
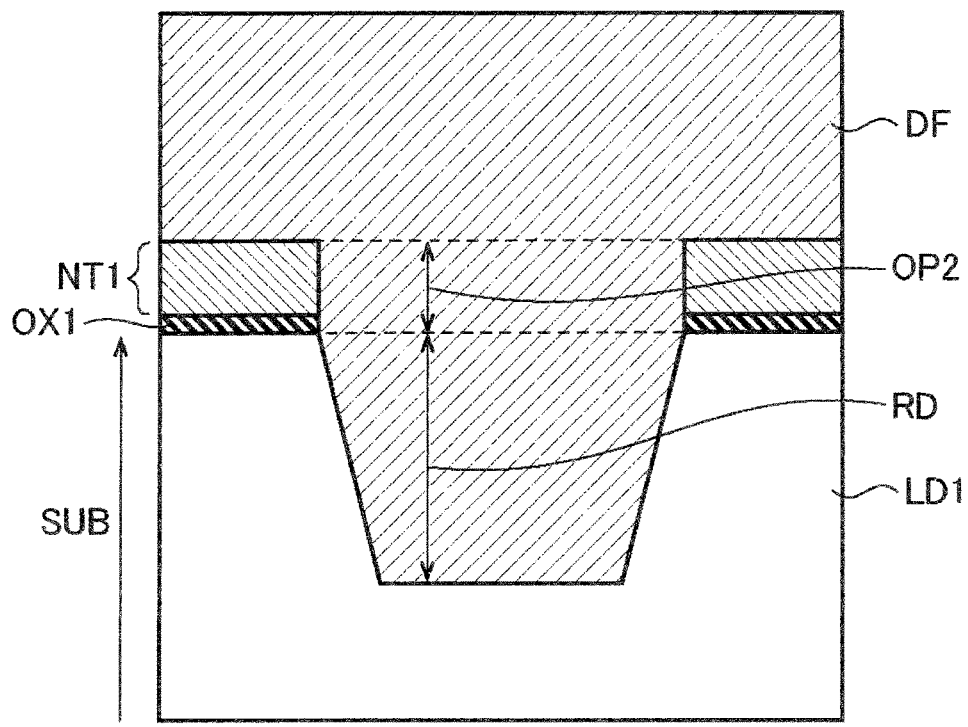
FIG. 8 is a sectional view illustrating the method of manufacturing the semiconductor device illustrated in FIG. 3.

Subsequently, as illustrated in FIG. 8, the insulating film DF (for example, a silicon oxide film) (the second insulating film) is formed on the substrate SUB and the nitride film NT1. In this way, the recess RD and the opening OP2 are filled with the insulating film DF. In addition, the insulating film DF is provided on the nitride film NT1. The insulating film DF is formed by, for example, chemical vapor deposition (CVD).

Figure 9:
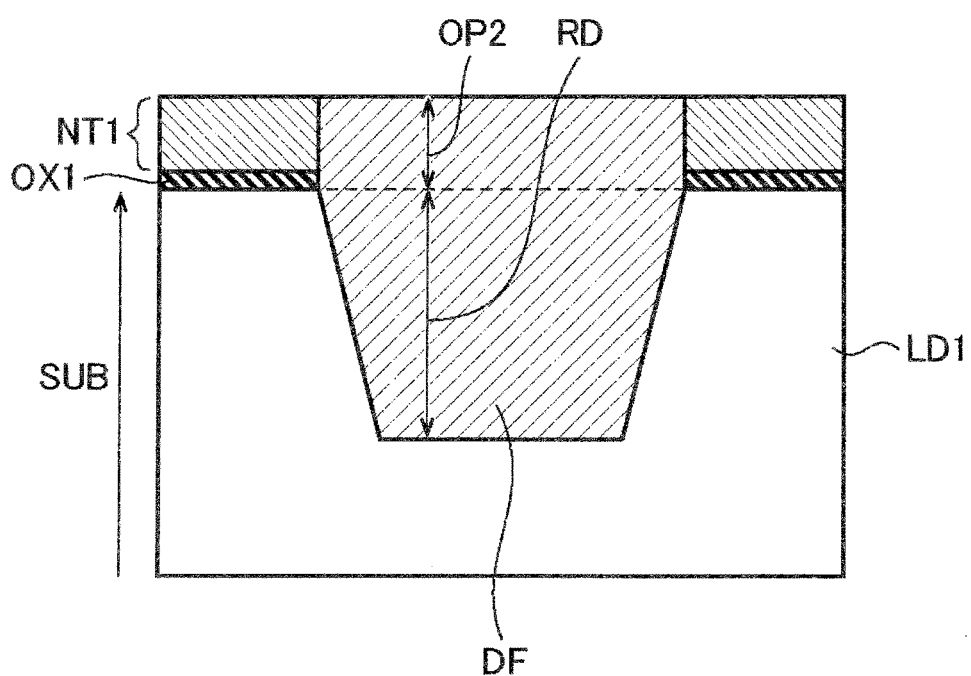
FIG. 9 is a sectional view illustrating the method of manufacturing the semiconductor device illustrated in FIG. 3.

Subsequently, as illustrated in FIG. 9, a surface portion of the insulating film DF is removed. The insulating film DF on the nitride film NT1 is thus removed. The insulating film DF is removed by, for example, chemical mechanical polishing (CMP).

Figure 10:
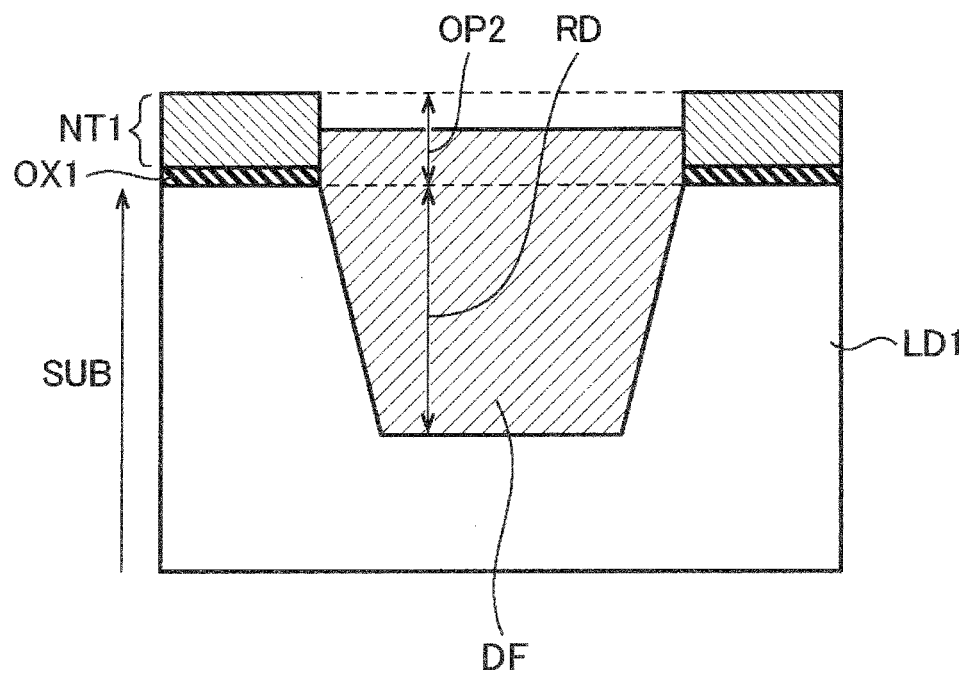
FIG. 10 is a sectional view illustrating the method of manufacturing the semiconductor device illustrated in FIG. 3.

Subsequently, as illustrated in FIG. 10, the surface portion of the insulating film DF is further removed. This allows the top of the insulating film DF to be lower than the top of the nitride film NT1. Furthermore, in the exemplary case illustrated in FIG. 10, the top of the insulating film DF is higher than the surface of the substrate SUB. The insulating film DF is removed by, for example, wet etching.

Figure 11:
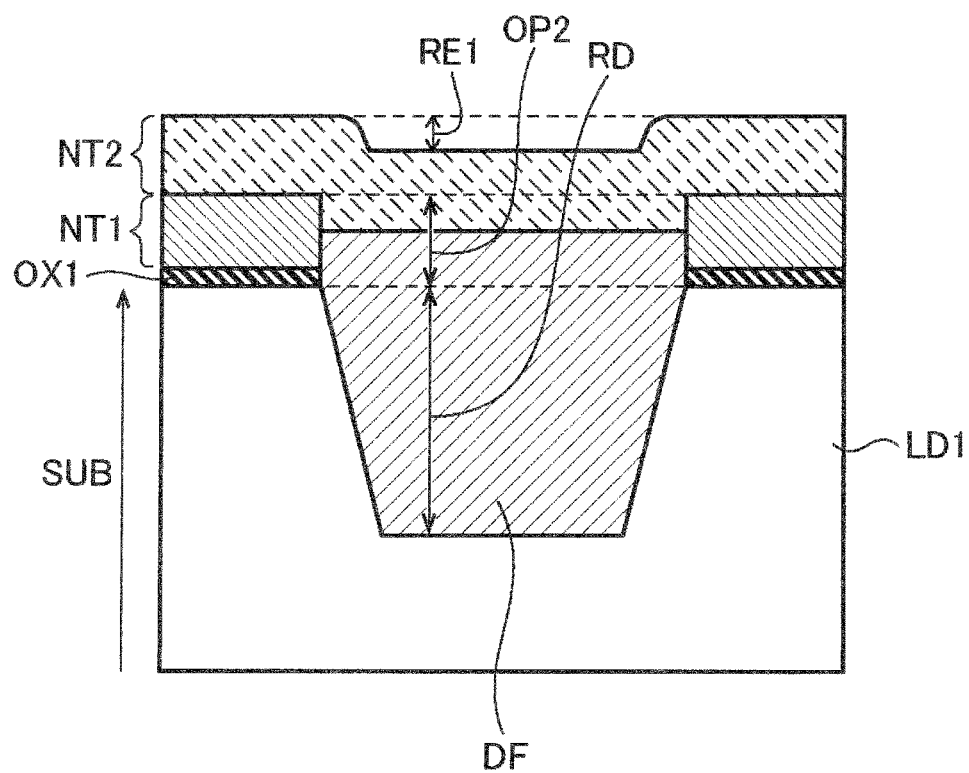
FIG. 11 is a sectional view illustrating the method of manufacturing the semiconductor device illustrated in FIG. 3.

Subsequently, as illustrated in FIG. 11, a nitride film NT2 (for example, a silicon nitride film) (a third insulating film) is formed on the insulating film DF and the nitride film NT1. In this case, as illustrated in FIG. 11, the nitride film NT2 has a recess RE1 in a region overlapping with the recess RD. This is because the top of the insulating film DF is lower than the top of the nitride film NT1. This results in a difference in level between the top of the insulating film DF and the top of the nitride film NT1. Such a difference in level causes formation of the recess RE1 on the top of the nitride film NT2. The recess RE1 has a depth of, for example, 10 to 100 nm.

Figure 12:
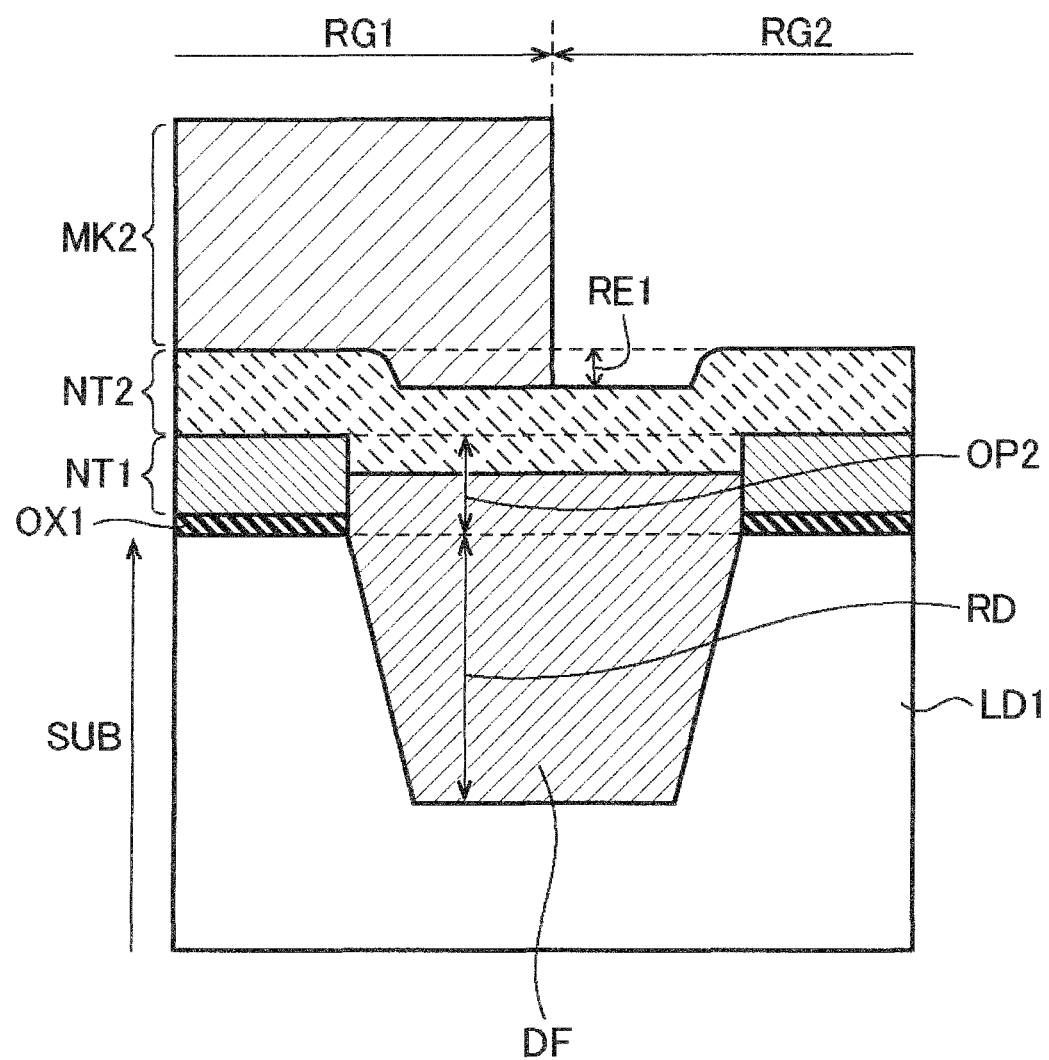
FIG. 12 is a sectional view illustrating the method of manufacturing the semiconductor device illustrated in FIG. 3.

Subsequently, as illustrated in FIG. 12, a mask film MK2 is formed on the nitride film NT2. In this case, the mask film MK2 covers a region (first region RG1) that internally contains part of the recess RE1 in a plan view. In other words, the mask film MK2 does not cover a region (second region RG2) that internally contains the rest of the recess RE1 in a plan view. In this case, the second region RG2 is a region in which the gate insulating film GI1 (FIG. 3) is formed in a later step.

Figure 13:
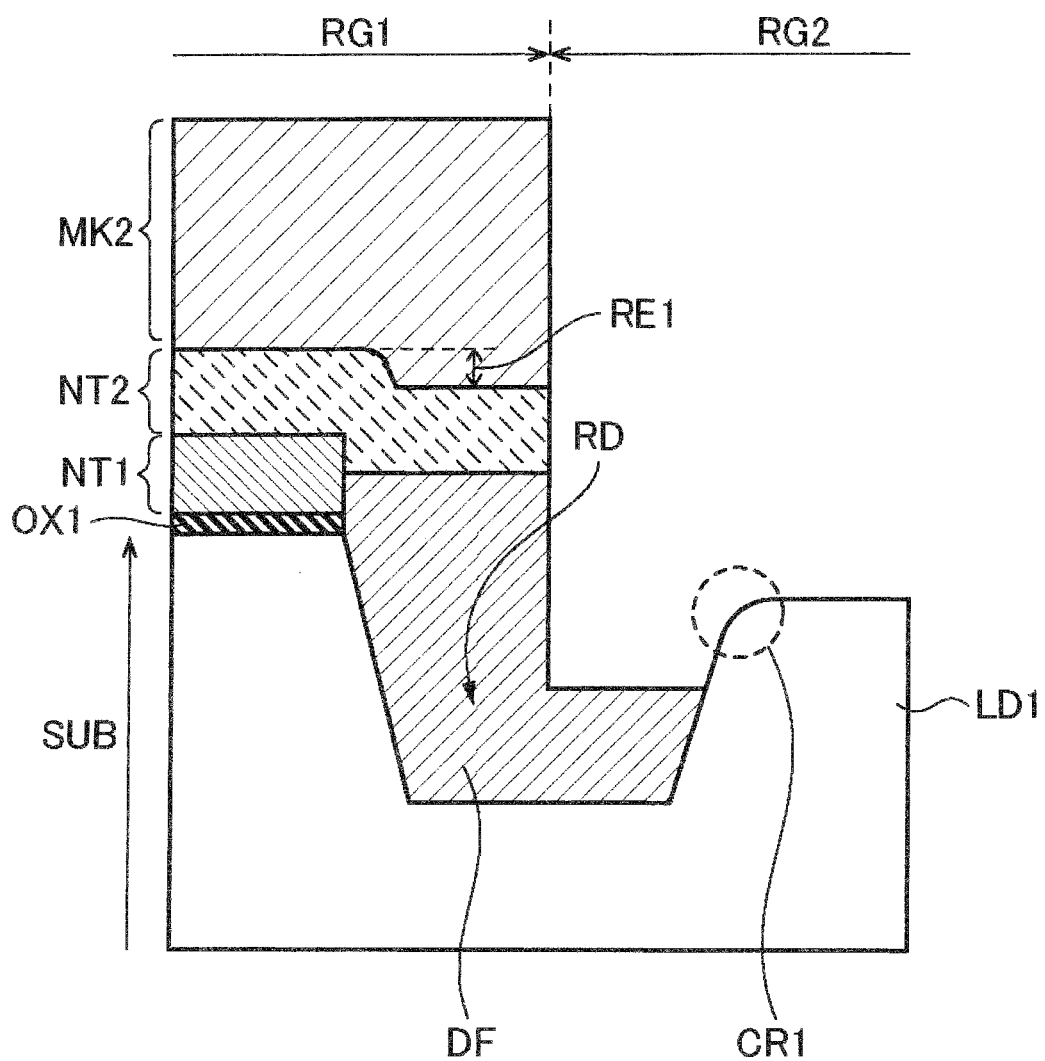
FIG. 13 is a sectional view illustrating the method of manufacturing the semiconductor device illustrated in FIG. 3.

Subsequently, as illustrated in FIG. 13, the nitride film NT2, the nitride film NT1, the oxide film OX1, and the insulating film DF are etched with the mask film MK2 as a mask. The nitride film NT2, the nitride film NT1, and the oxide film OX1 are thus removed from the second region RG2. In addition, the top of the insulating film DF is located below the upper end of the recess RD in the second region RG2. In this case, part of the substrate SUB is removed from the second region RG2. In addition, as described later in detail, the angle (angle CR1) defined by the inner side face of the recess RD and the surface of the substrate SUB is rounded in the second region RG2. Subsequently, the mask film MK2 is removed.

The reason why the angle CR1 is rounded is now described. As illustrated in FIG. 12, the top of the nitride film NT2 has a difference in level caused by the recess RE1. In the exemplary case illustrated in FIGS. 12 and 13, etching proceeds substantially evenly in a thickness direction of the substrate SUB in any region. In such a case, the configuration of the difference in level of the nitride film NT2 is transferred onto the surface of the substrate SUB. The angle CR1 is thus rounded.

Figure 14:
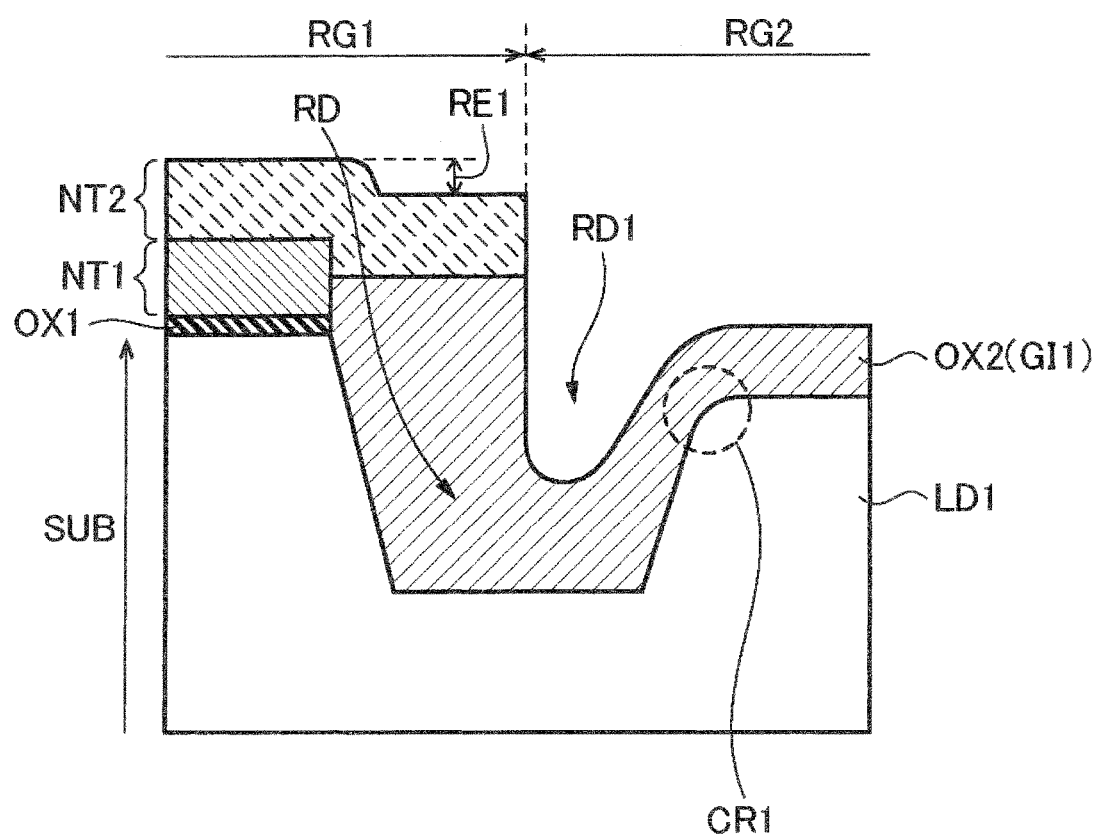
FIG. 14 is a sectional view illustrating the method of manufacturing the semiconductor device illustrated in FIG. 3.

Subsequently, as illustrated in FIG. 14, while the nitride film NT2 is left in the first region RG1, an oxide film OX2 is formed on the substrate SUB in the second region RG2 by thermal oxidation, for example. The oxide film OX2 is to be the gate insulating film GI1. In this case, a recess (the recess RD1) having the oxide film OX2 (a gate insulating film GI2) on its side face is formed in the insulating film DF in the recess RD. Subsequently, the gate electrode GE1 and the sidewall SW1 are formed. Consequently, the semiconductor device illustrated in FIG. 3 is manufactured.

FIGS. 15 to 19 are sectional views each illustrating a method of manufacturing a semiconductor device according to a comparative example. The comparative example is similar to the first embodiment except for the following points. In the comparative example, the steps illustrated in FIGS. 6 to 9 are performed as in the first embodiment.

Figure 15:
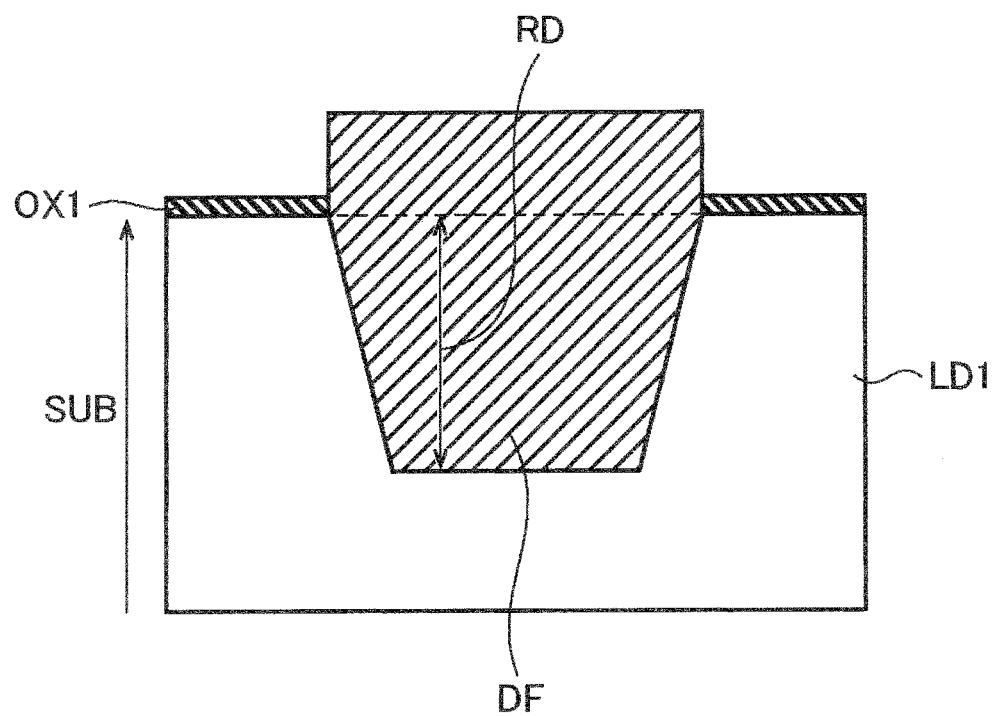
FIG. 15 is a sectional view illustrating a method of manufacturing a semiconductor device according to a comparative example.

Subsequently, as illustrated in FIG. 15, the nitride film NT1 (FIG. 9) is removed. The top of the insulating film DF is thus located above the top of the oxide film OX1 (substrate SUB).

Figure 16:
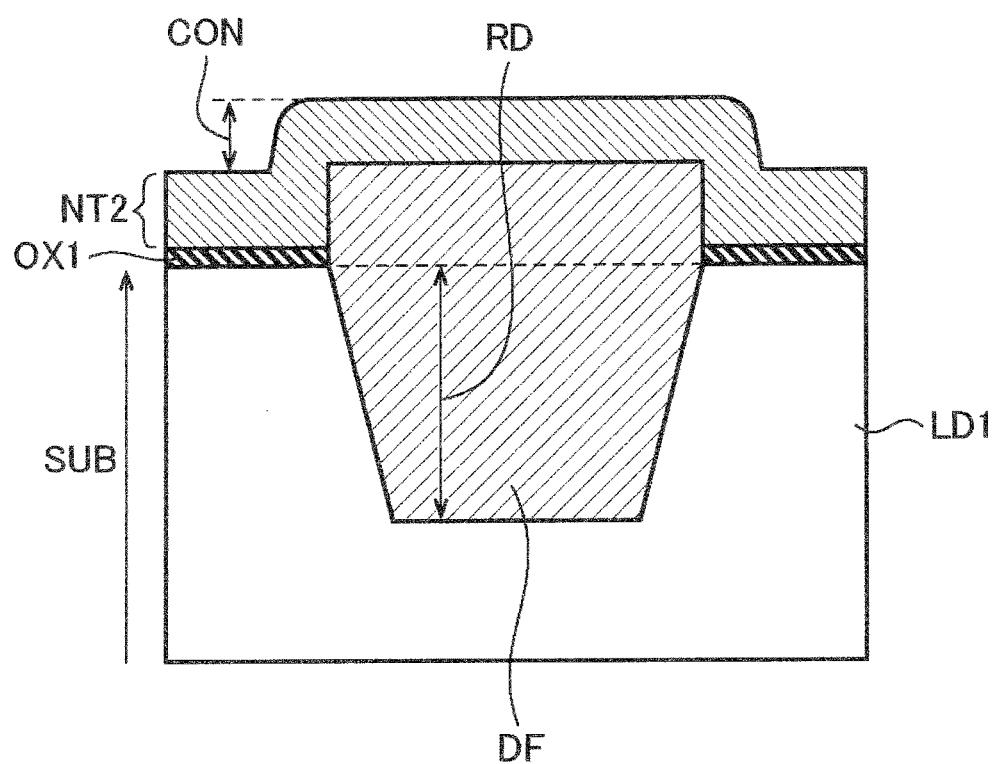
FIG. 16 is a sectional view illustrating the method of manufacturing the semiconductor device according to the comparative example.

Subsequently, as illustrated in FIG. 16, the nitride film NT2 is formed on the oxide film OX1 (substrate SUB) and the insulating film DF. In this case, as illustrated in FIG. 16, the top of the nitride film NT2 has a convex portion CON over the recess RD. This is because the top of the insulating film DF is lower than the top of the oxide film OX1 (substrate SUB). This results in a difference in level between the top of the insulating film DF and the top of the oxide film OX1 (substrate SUB). Such a difference in level causes formation of the convex portion CON on the top of the nitride film NT2.

Figure 17:
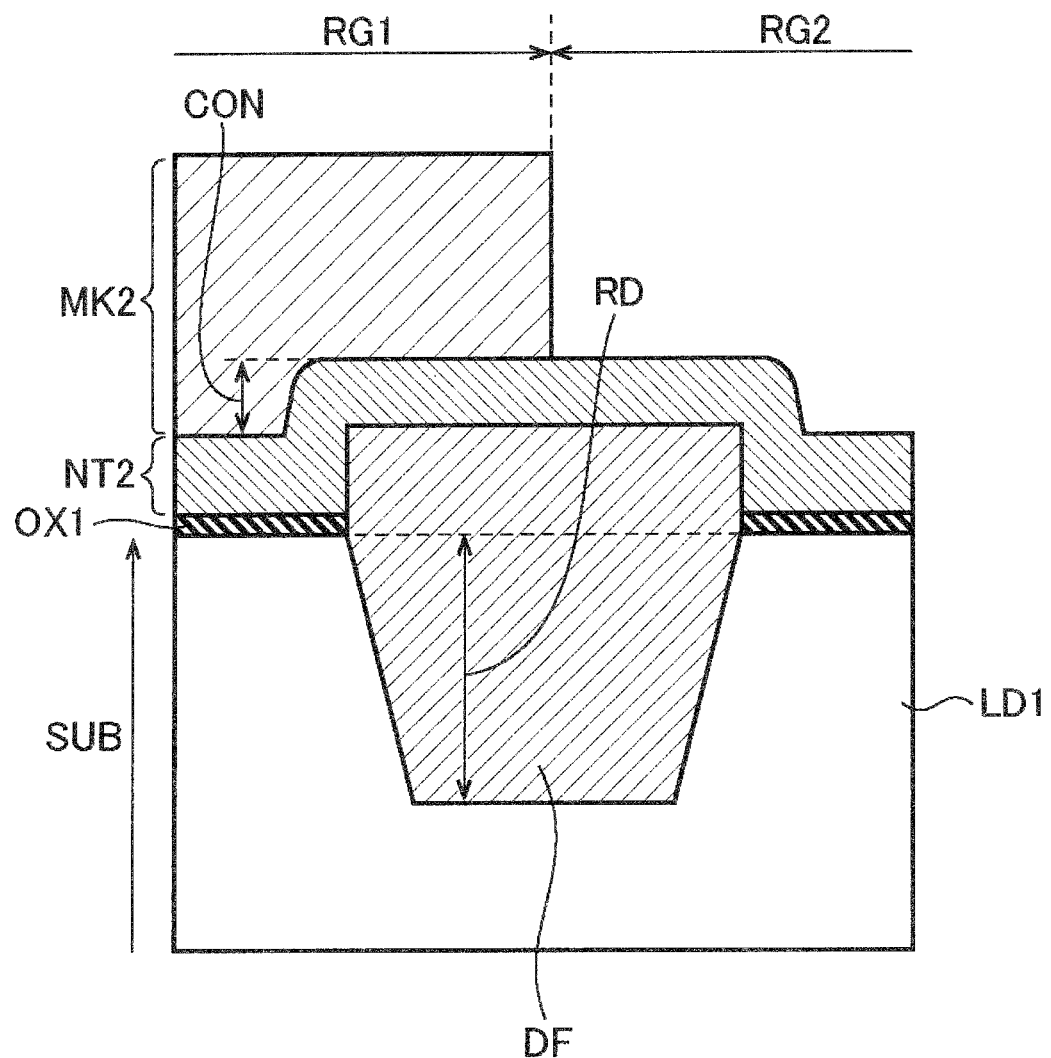
FIG. 17 is a sectional view illustrating the method of manufacturing the semiconductor device according to the comparative example.

Subsequently, as illustrated in FIG. 17, the mask film MK2 is formed on the nitride film NT2. In this case, the mask film MK2 covers a region (the first region RG1) that internally contains part of the convex portion CON in a plan view. In other words, the mask film MK2 does not cover a region (the second region RG2) that internally contains the rest of the convex portion CON in a plan view. In this case, the second region RG2 is a region in which the gate insulating film GI1 (FIG. 3) is formed in a later step.

Figure 18:
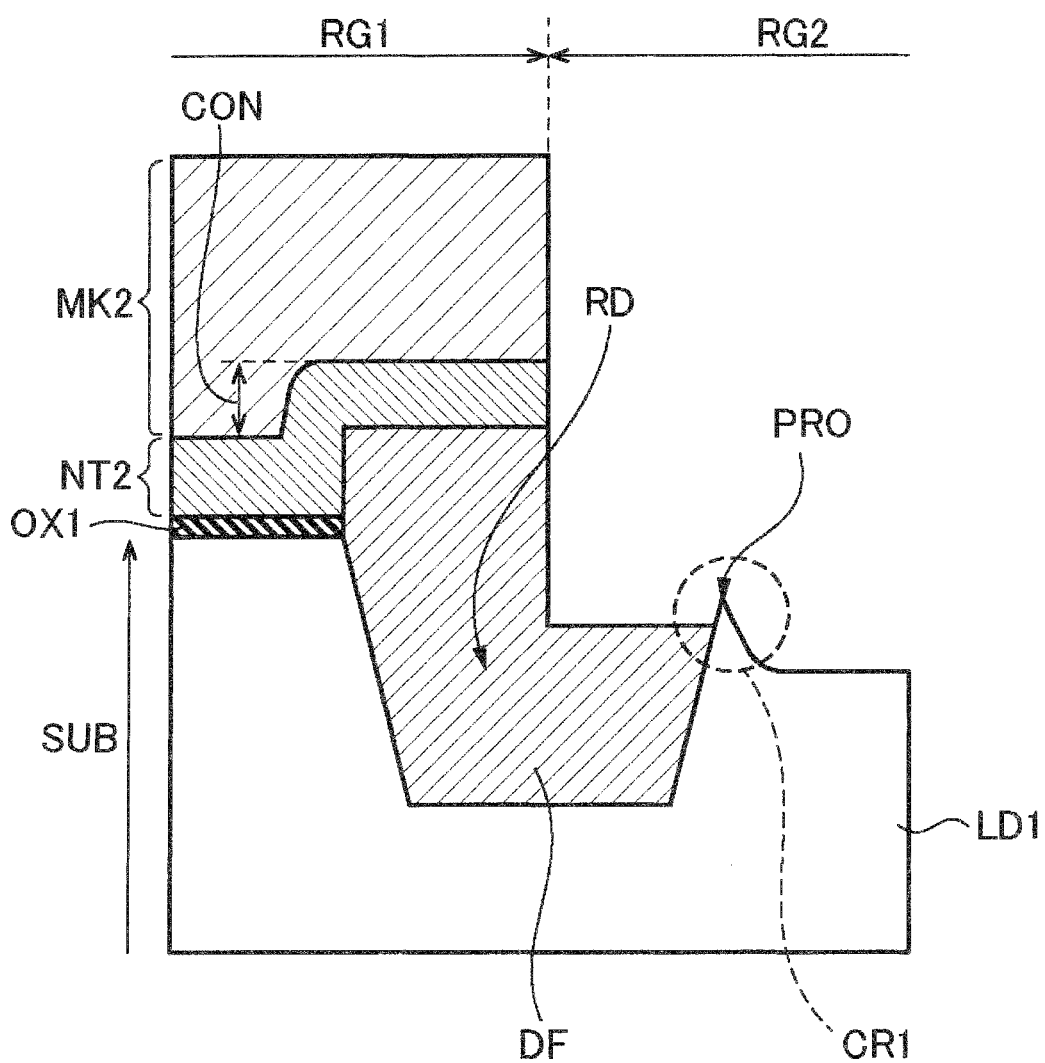
FIG. 18 is a sectional view illustrating the method of manufacturing the semiconductor device according to the comparative example.

Subsequently, as illustrated in FIG. 18, the nitride film NT2, the oxide film OX1, and the insulating film DF are etched with the mask film MK2 as a mask. The nitride film NT2 and the oxide film OX1 are thus removed from the second region RG2. Furthermore, the top of the insulating film DF is located below the upper end of the recess RD in the second region RG2. In this case, part of the substrate SUB is removed from the second region RG2. In addition, as described later in detail, the angle (angle CR1) defined by the inner side face of the recess RD and the surface of the substrate SUB has a projection PRO in the second region RG2. The projection PRO projects upward from the surface of the substrate SUB. Subsequently, the mask film MK2 is removed.

The reason why the projection PRO is formed is now described. As illustrated in FIG. 17, the top of the nitride film NT2 has the difference in level caused by the convex portion CON. In the exemplary case illustrated in FIGS. 17 and 18, etching proceeds substantially evenly in a thickness direction of the substrate SUB in any region. As illustrated in FIG. 17, the nitride film NT2 has a larger thickness (thickness in the thickness direction of the substrate SUB) in a region having the difference in level than in another region. In such a case, the region having the difference in level is etched slowly and arrives late at the substrate SUB compared with another region. This results in a difference in etched amount of the substrate SUB between the region having the difference in level and another region. As a result, the projection PRO is formed.

Figure 19:
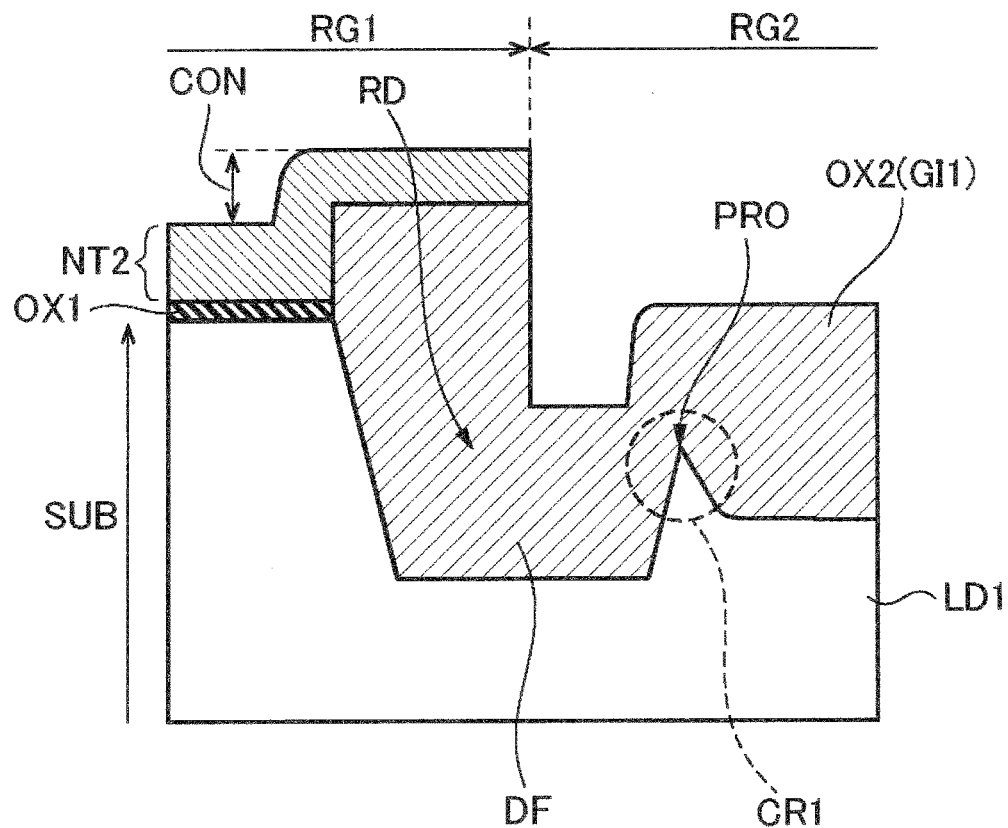
FIG. 19 is a sectional view illustrating the method of manufacturing the semiconductor device according to the comparative example.

Subsequently, as illustrated in FIG. 19, while the nitride film NT2 is left in the first region RG1, an oxide film OX2 is formed on the substrate SUB in the second region RG2 by thermal oxidation, for example. The oxide film OX2 is to be the gate insulating film GI1. In this case, the projection PRO remains on the substrate SUB. Such a projection PRO may cause electric field concentration.

The first embodiment (FIGS. 6 to 14) is now compared with the comparative example (FIGS. 15 to 19). In the first embodiment, as illustrated in FIG. 11, the top of the nitride film NT2 has the recess RE1 over the recess RD. As described above, the angle (angle CR1) defined by the inner side face of the recess RD and the surface of the substrate SUB is rounded due to the recess RE1 (FIG. 13). In contrast, in the comparative example, as illustrated in FIG. 16, the top of the nitride film NT2 has the convex portion CON on the recess RD. As described above, the angle CR1 has the projection PRO due to the convex portion CON (FIG. 18). As clear from this comparison, whether the angle CR1 is rounded or has the projection PRO is determined depending on the shape of the top of the nitride film NT2.

As described above, the angle CR1 in the first embodiment is rounded as illustrated in FIG. 13. This makes it possible to suppress electric field concentration at the angle CR1. In contrast, the angle CR1 in the comparative example has the projection PRO as illustrated in FIG. 18. The projection PRO may thus cause electric field concentration in the comparative example. As clear from this comparison, electric field concentration at the angle CR1 can be more suppressed in the first embodiment than in the comparative example.

As described above, according to the first embodiment, the angle (angle CR1) defined by the inner side face of the recess RD and the surface of the substrate SUB is rounded. This makes it possible to effectively suppress electric field concentration at the angle CR1.

FIGS. 20 to 25 illustrate a modification of the method illustrated in FIGS. 6 to 14. This modification is similar to the first embodiment except for the following points. In this modification, the steps illustrated in FIGS. 6 to 9 are performed as in the first embodiment.

Figure 20:
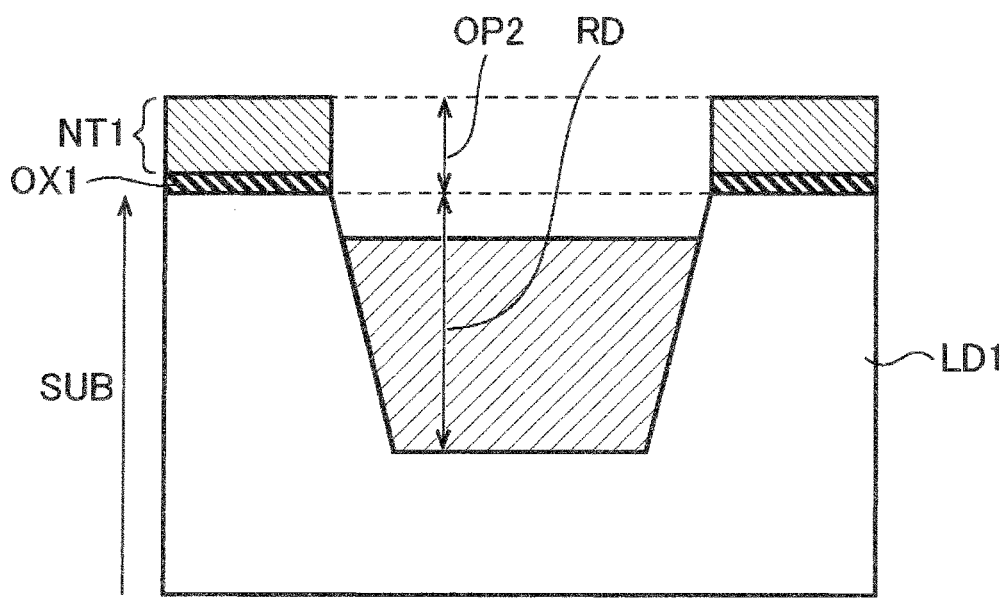
FIG. 20 illustrates a modification of the method illustrated in FIGS. 6 to 14.

Subsequently, as illustrated in FIG. 20, the surface portion of the insulating film DF is further removed. This allows the top of the insulating film DF to be lower than the upper end of the recess RD. The insulating film DF is removed by wet etching, for example.

Figure 21:
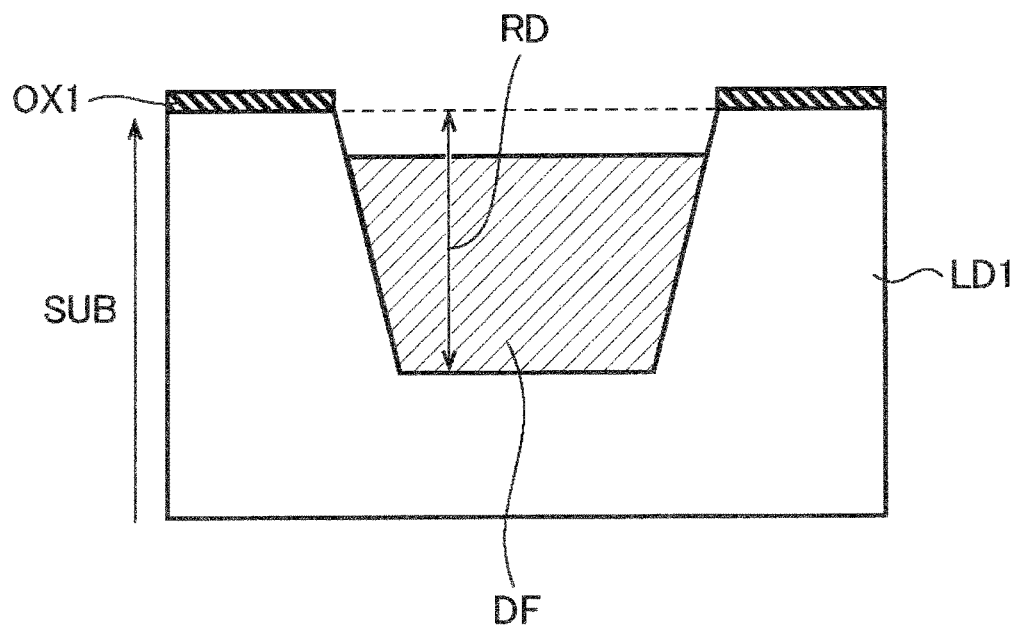
FIG. 21 illustrates the modification of the method illustrated in FIGS. 6 to 14.

Subsequently, as illustrated in FIG. 21, the nitride film NT1 (FIG. 20) is removed.

Figure 22:
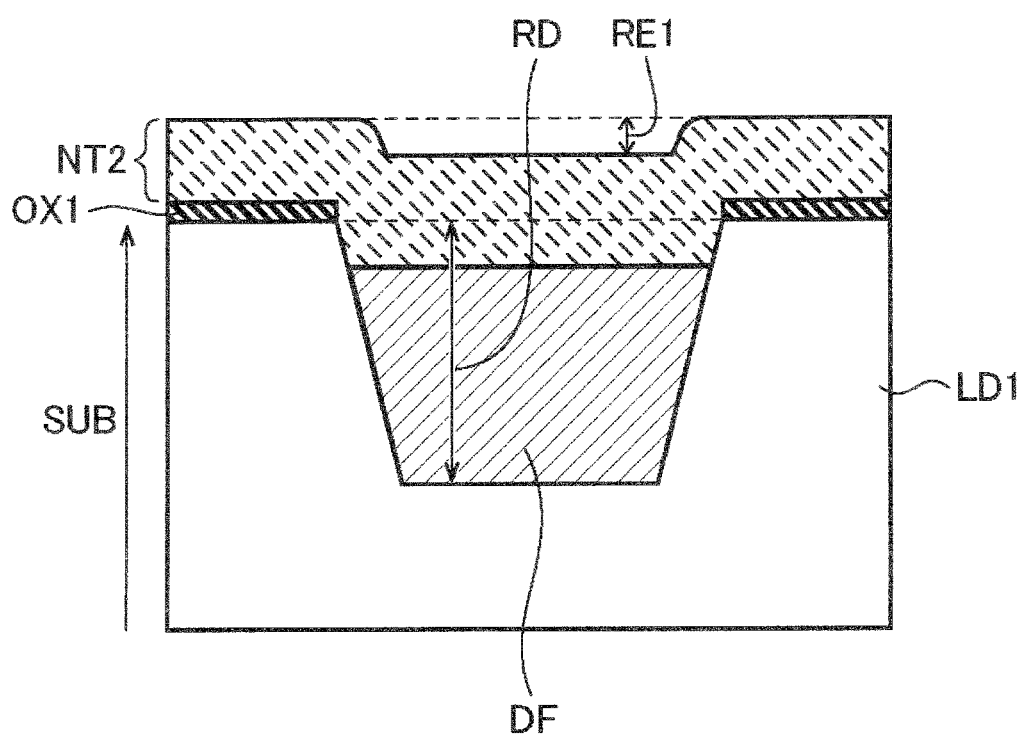
FIG. 22 illustrates the modification of the method illustrated in FIGS. 6 to 14.

Subsequently, as illustrated in FIG. 22, the nitride film NT2 (third insulating film) is formed on the oxide film OX1 (substrate SUB) and the insulating film DF. In this case, as illustrated in FIG. 22, the nitride film NT2 has a recess RE1 in a region overlapping with the recess RD. This is because the top of the insulating film DF is lower than the top of the oxide film OX1 (substrate SUB). This results in a difference in level between the top of the insulating film DF and the top of the oxide film OX1 (substrate SUB). Such a difference in level causes formation of the recess RE1 on the top of the nitride film NT2.

Figure 23:
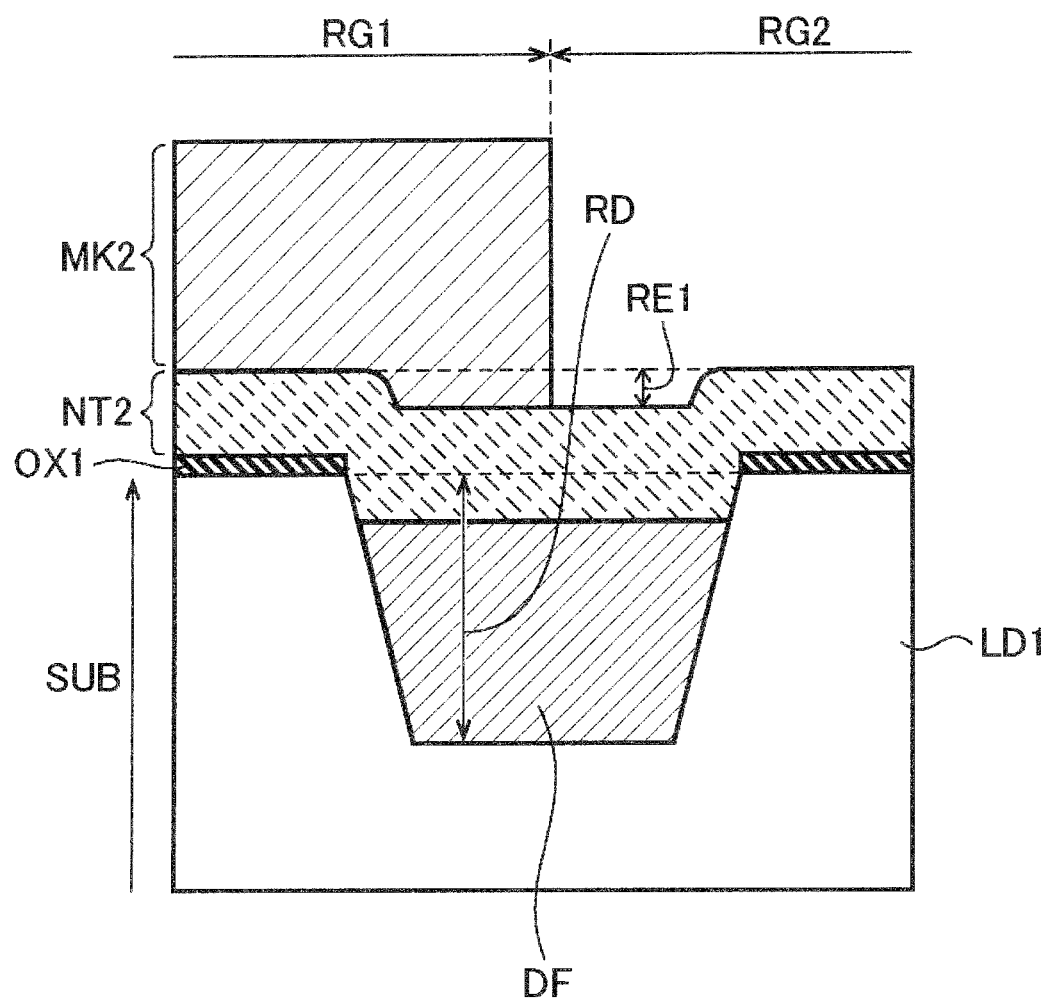
FIG. 23 illustrates the modification of the method illustrated in FIGS. 6 to 14.

Subsequently, as illustrated in FIG. 23, the mask film MK2 is formed on the nitride film NT2. In this case, the mask film MK2 covers a region (the first region RG1) that internally contains part of the recess RE1 in a plan view. In other words, the mask film MK2 does not cover a region (the second region RG2) that internally contains the rest of the recess RE1 in a plan view. In this case, the second region RG2 is to have the gate insulating film GI1 (FIG. 3) in a later step.

Figure 24:
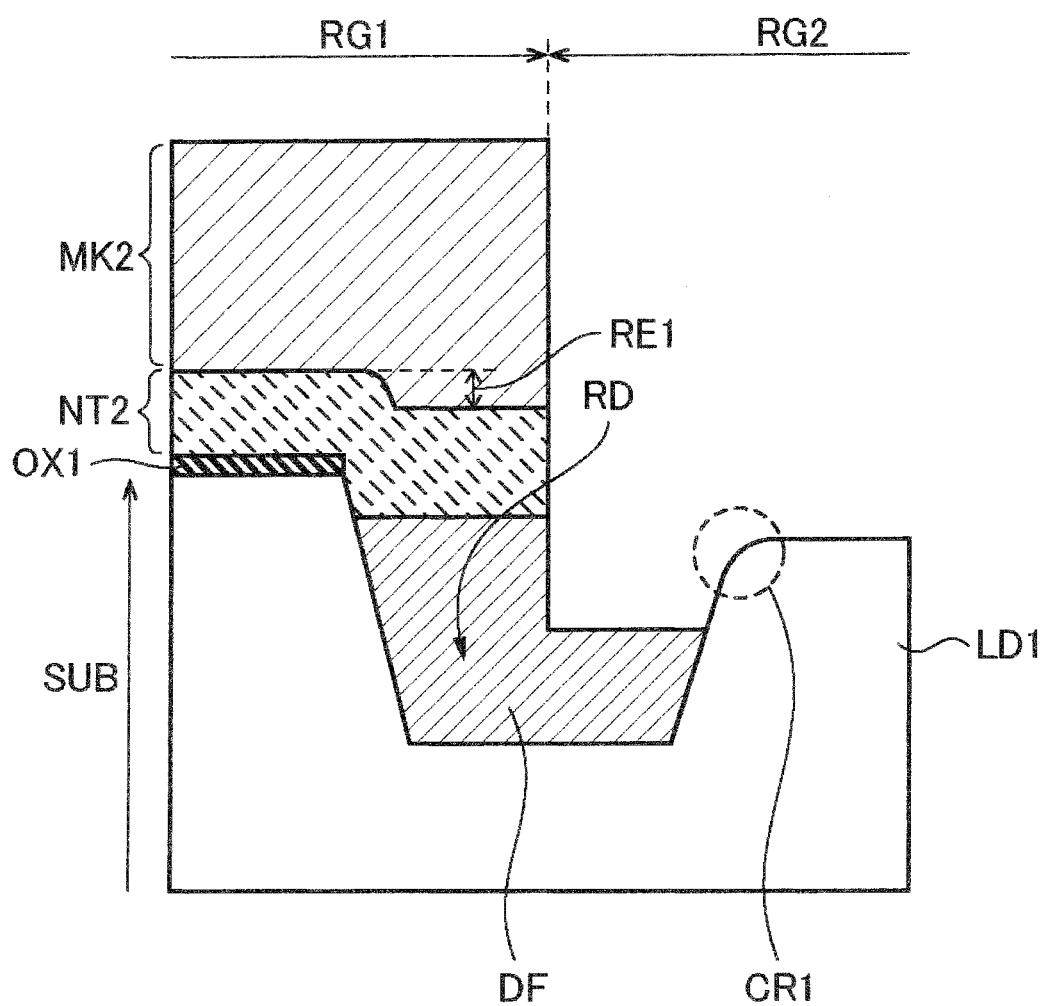
FIG. 24 illustrates the modification of the method illustrated in FIGS. 6 to 14.

Subsequently, as illustrated in FIG. 24, the nitride film NT2, the oxide film OX1, and the insulating film DF are etched with the mask film MK2 as a mask. The nitride film NT2 and the oxide film OX1 are thus removed from the second region RG2. Furthermore, the top of insulating film DF is located below the upper end of the recess RD in the second region RG2. In this case, part of the substrate SUB is removed from the second region RG2. In addition, as in the first embodiment (for example, FIG. 13), an angle (angle CR1) defined by an inner side face of the recess RD and the surface of the substrate SUB is rounded in the second region RG2. Subsequently, the mask film MK2 is removed.

Figure 25:
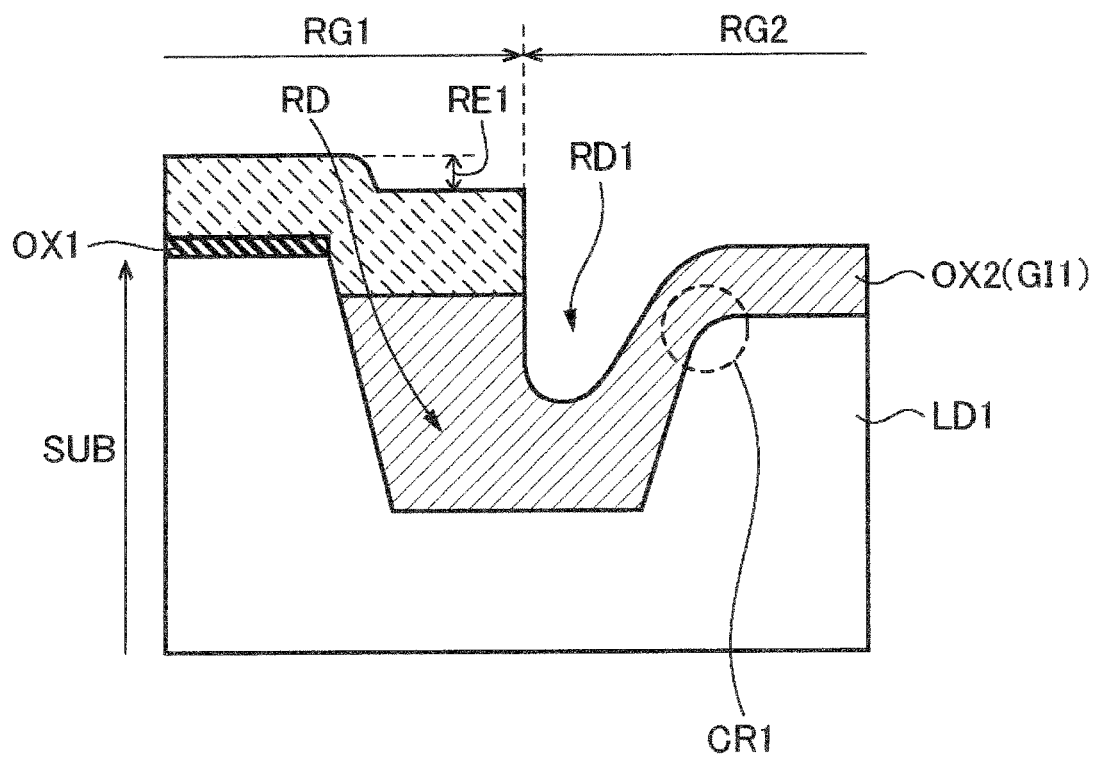
FIG. 25 illustrates the modification of the method illustrated in FIGS. 6 to 14.

Subsequently, as illustrated in FIG. 25, while the nitride film NT2 is left in the first region RG1, the oxide film OX2 is formed on the substrate SUB in the second region RG2 by thermal oxidation, for example. The oxide film OX2 is to be the gate insulating film GI1. In this case, a recess (recess RD1) having the oxide film OX2 (gate insulating film GI2) on its side face is formed in the insulating film DF in the recess RD.

In this modification, as in the first embodiment, the angle (angle CR1) defined by the inner side face of the recess RD and the surface of the substrate SUB is rounded. This makes it possible to effectively suppress electric field concentration at the angle CR1.

Second Embodiment

Figure 26:
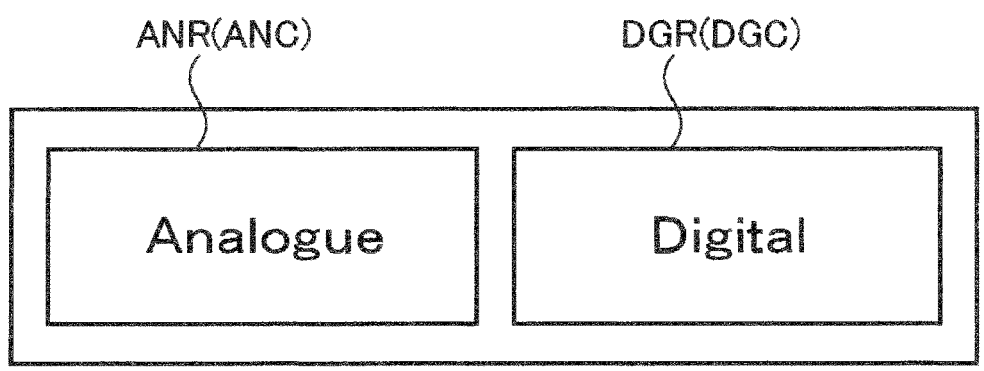
FIG. 26 is a plan view illustrating a configuration of a semiconductor device according to a second embodiment.

FIG. 26 is a plan view illustrating a configuration of a semiconductor device according to a second embodiment. The semiconductor device according to the second embodiment has a configuration similar to that of the first embodiment except for the following points.

In the exemplary case illustrated in FIG. 26, the semiconductor device is a liquid crystal display (LCD) driver. In detail, as illustrated in FIG. 26, the semiconductor device has an analog region ANR and a digital region DGR on the same substrate SUB. The substrate SUB is a semiconductor substrate, for example, a silicon substrate or a silicon on insulator (SOI) substrate. The substrate SUB has a rectangular planar shape. The analog region ANR and the digital region DGR are opposed to each other in the longitudinal direction of such a rectangle. The planar layout of the semiconductor device is not limited to the exemplary case illustrated in FIG. 26.

The analog region ANR contains an analog circuit ANC (a first circuit). The digital region DGR contains a digital circuit DGC (a second circuit). The analog circuit ANC has a power supply potential being a first voltage. The digital circuit DGC has a power supply potential being a second voltage. The second voltage is lower than the first voltage. For example, the first voltage is about 10 V, and the second voltage is about 1 V. For example, the analog circuit ANC generates a voltage for driving LCD. For example, the digital circuit DGC is a logic circuit.

Figure 27:
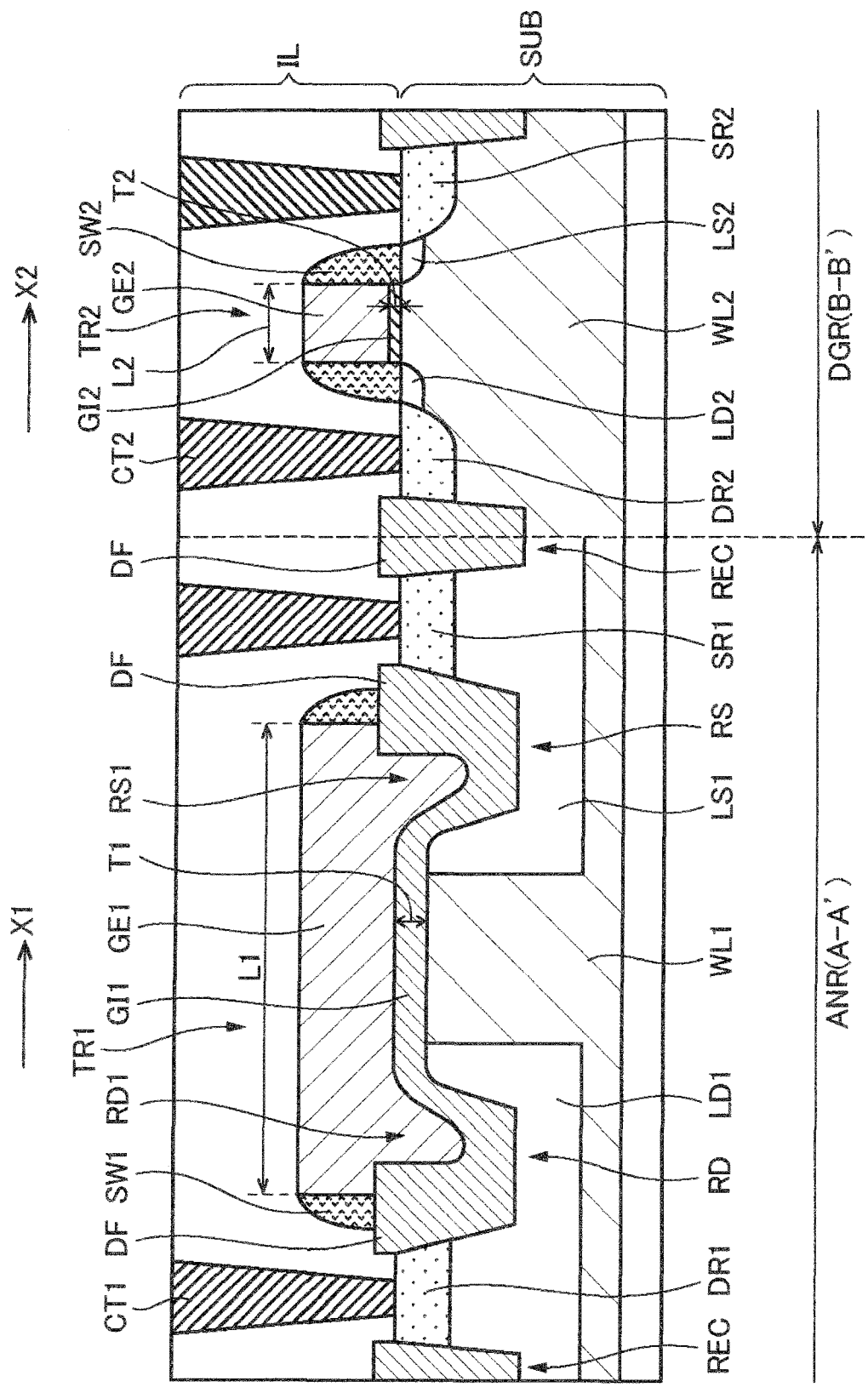
FIG. 27 is a sectional view illustrating a configuration of a transistor.
Figure 28:
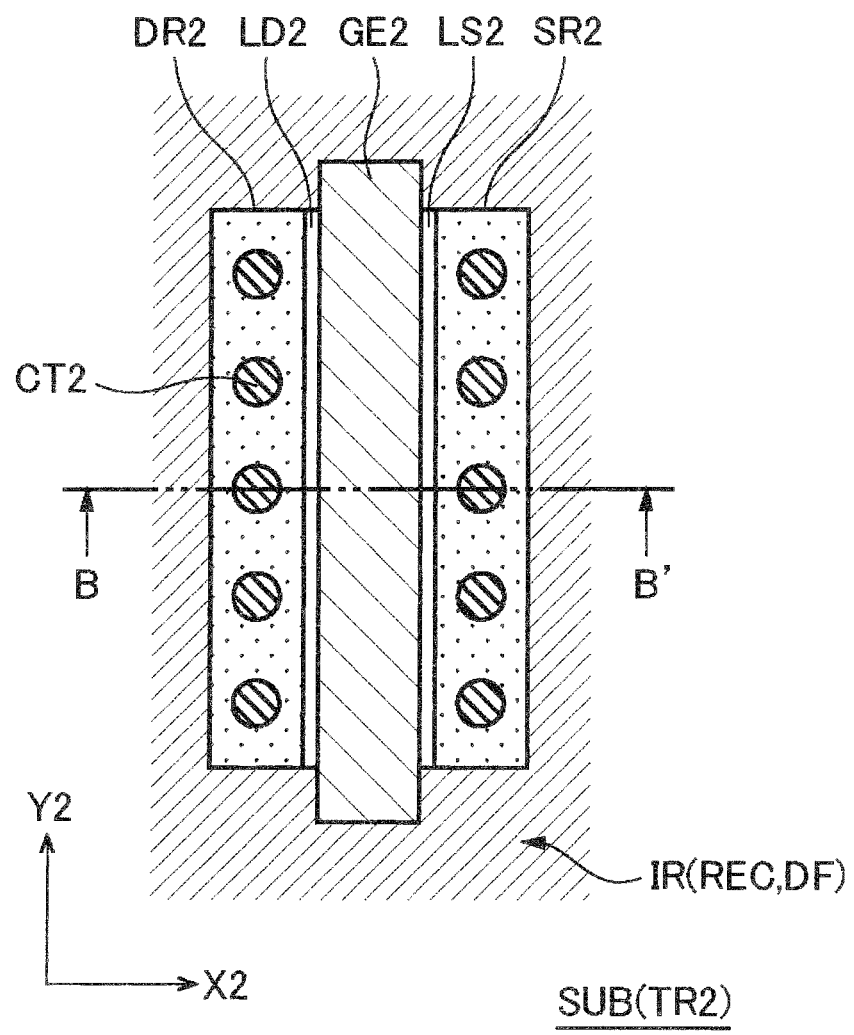
FIG. 28 is a plan view illustrating the configuration of the transistor.

FIG. 27 is a sectional view illustrating a configuration of each of transistors TR1 and TR2. FIG. 28 is a plan view illustrating the configuration of the transistor TR2. The analog region ANR illustrated in FIG. 27 corresponds to FIG. 2. The digital region DGR illustrated in FIG. 27 corresponds to a section along B-B' in FIG. 28.

In the second embodiment, the transistor TR1 configures the analog circuit ANC illustrated in FIG. 26. The transistor TR2 configures the digital circuit DGC illustrated in FIG. 26. As illustrated in FIG. 27, the transistor TR1 and the transistor TR2 are formed using the same substrate SUB. The transistor TR1 according to the second embodiment has a configuration similar to that of the transistor TR1 according to the first embodiment.

As illustrated in FIG. 27, the substrate SUB has a well WL2 in the digital region DGR. The transistor TR2 is formed using the well WL2. The transistor TR2 includes a gate electrode GE2, a gate insulating film GI2, a drain region DR2, a source region SR2, an LDD region LD2, an LDS region LS2, and a sidewall SW2.

A planar layout of the transistor TR2 is described with reference to FIG. 28. In the transistor TR2, a drain (drain region DR2), a gate electrode GE2, and a source (source region SR2) are arranged in this order in a third direction (X2 direction). Each of the drain region DR2, the gate electrode GE2, and the source region SR2 extends in a fourth direction (Y2 direction) perpendicular to the third direction. The third direction (X2 direction) and the fourth direction (Y2 direction) may be equal to or different from the first direction (X1 direction) and the second direction (Y1 direction) (FIG. 1), respectively.

As described above, the substrate SUB has the isolation region IR. As illustrated in FIG. 28, the drain region DR2 and the source region SR2 are each defined by the isolation region IR. In the exemplary case illustrated in FIG. 28, the isolation region IR is not provided between the drain region DR2 and the source region SR2. The LDD region LD2, the gate electrode GE2, and the LDS region LS2 are located between the drain region DR2 and the source region SR2.

The drain region DR2 has a plurality of contacts CT2. The contacts CT2 are arranged in the fourth direction (Y2 direction). The source region SR2 also has a plurality of contacts CT2. Such contacts CT2 are also arranged in the fourth direction (Y2 direction).

A sectional structure of the transistor TR2 is now described with reference to FIG. 27. As illustrated in FIG. 27, the transistor TR2 includes the gate electrode GE2 on the substrate SUB, and includes the drain region DR2 and the source region SR2 in the substrate SUB (well WL2).

As illustrated in FIG. 27, the LDD region LD2 is located between the gate electrode GE2 and the drain region DR2. The LDD region LD2 has a conductivity type opposite to that of the well WL2, and has an impurity concentration lower than that of the drain region DR2. Likewise, the LDS region LS2 is located between the gate electrode GE2 and the source region SR2. The LDS region LS2 has a conductivity type opposite to that of the well WL2, and has an impurity concentration lower than that of the source region SR2.

The gate insulating film GI2 is located between the substrate SUB and the gate electrode GE2. In the second embodiment, the gate insulating film GI2 is, for example, an insulating film of the same type as the gate insulating film GI1 (for example, a silicon oxide film). The thickness T2 of the gate insulating film GI2 is smaller than the thickness T1 of the gate insulating film GI1. This is because the power supply potential (second voltage) of the digital circuit DGC is lower than the power supply potential (first voltage) of the analog circuit ANC. In other words, the withstand voltage of the transistor TR2 (the transistor configuring the digital circuit DGC) may be lower than the withstand voltage of the transistor TR1 (the transistor configuring the analog circuit ANC). This allows the thickness T2 of the gate insulating film GI2 to be smaller than the thickness T1 of the gate insulating film GI1.

Furthermore, in the exemplary case illustrated in FIG. 27, the length L2 of the gate electrode GE2 in the third direction (X2 direction) is shorter than the length L1 of the gate electrode GE1 in the first direction (X1 direction). This is because the withstand voltage of the transistor TR2 may be lower than the withstand voltage of the transistor TR1 as described above. This allows the length L2 of the gate electrode GE2 to be shorter than the length L1 of the gate electrode GE1.

The transistor TR2 is covered with the insulating layer IL as with the transistor TR1. The contacts CT2 are buried in the insulating layer IL. The contacts CT2 on a drain region DR2 side are coupled to the drain region DR2. The contacts CT2 on a source region SR2 side are coupled to the source region SR2.

Figure 29:
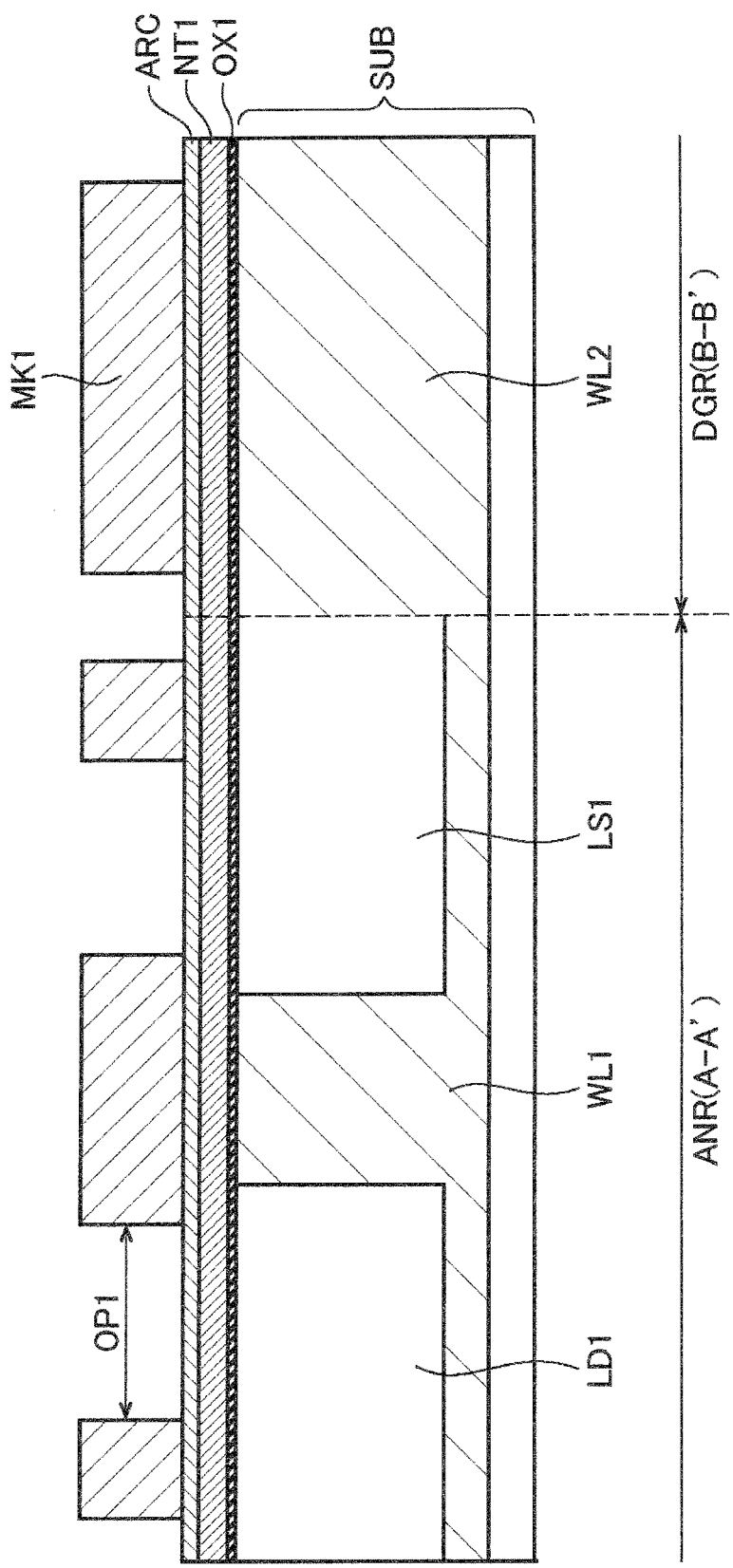
FIG. 29 is a sectional view illustrating a method of manufacturing the semiconductor device illustrated in FIG. 27.

FIGS. 29 to 39 are sectional views illustrating a method of manufacturing the semiconductor device illustrated in FIG. 27. First, as illustrated in FIG. 29, the wells WL1 and WL2 are formed in the substrate SUB. Subsequently, the LDD region LD1 and the LDS region LS1 are formed in the well WL1. Subsequently, an oxide film OX1 (for example, a silicon oxide film), a nitride film NT1, an antireflection coating ARC, and a mask film MK1 are stacked in this order on the substrate SUB. Subsequently, openings OP1 are formed in the mask film MK1.

Figure 30:
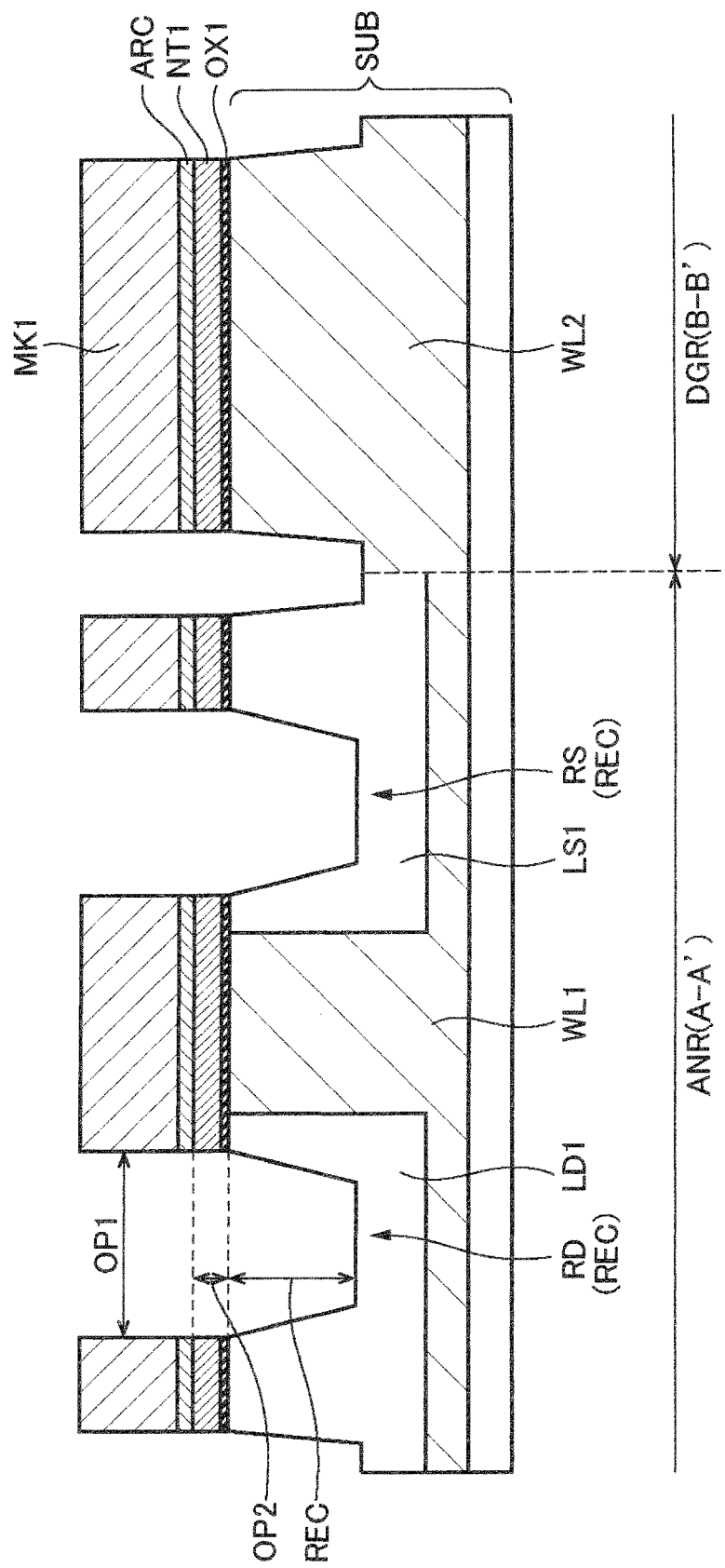
FIG. 30 is a sectional view illustrating the method of manufacturing the semiconductor device illustrated in FIG. 27.

Subsequently, as illustrated in FIG. 30, the nitride film NT1, the oxide film OX1, and the substrate SUB are etched with the mask film MK1 as a mask. Openings OP2 are thus formed through the nitride film NT1 and the oxide film OX1. Furthermore, the recesses REC are formed in the substrate SUB through the openings OP2. In this case, the recesses REC include recesses RD and RS in the analog region ANR. Subsequently, the mask film MK1 and the antireflection coating ARC are removed.

Figure 31:
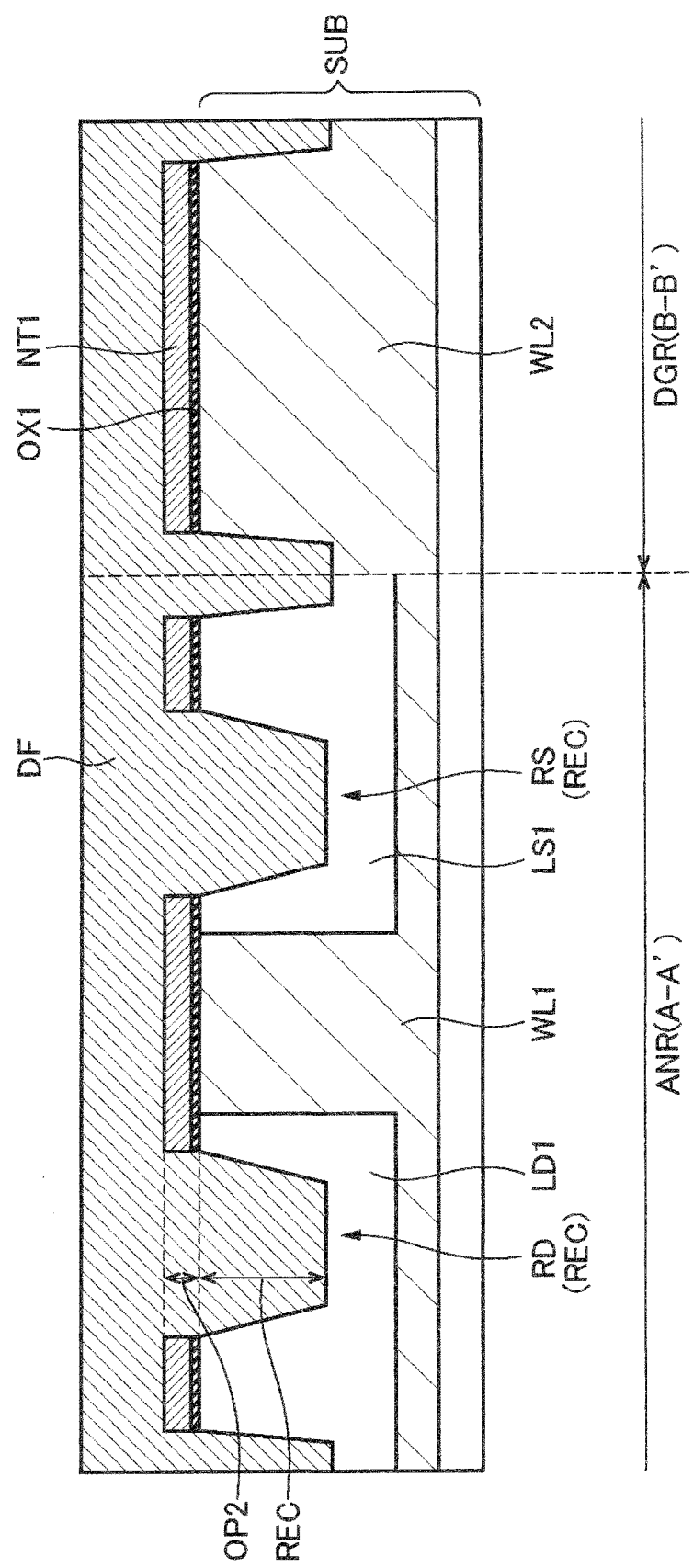
FIG. 31 is a sectional view illustrating the method of manufacturing the semiconductor device illustrated in FIG. 27.

Subsequently, as illustrated in FIG. 31, the insulating film DF is formed on the substrate SUB and the nitride film NT1. The recesses REC and the openings OP2 are thus filled with the insulating film DF. In addition, the insulating film DF is provided on the nitride film NT1. The insulating film DF is formed by, for example, chemical vapor deposition (CVD).

Figure 32:
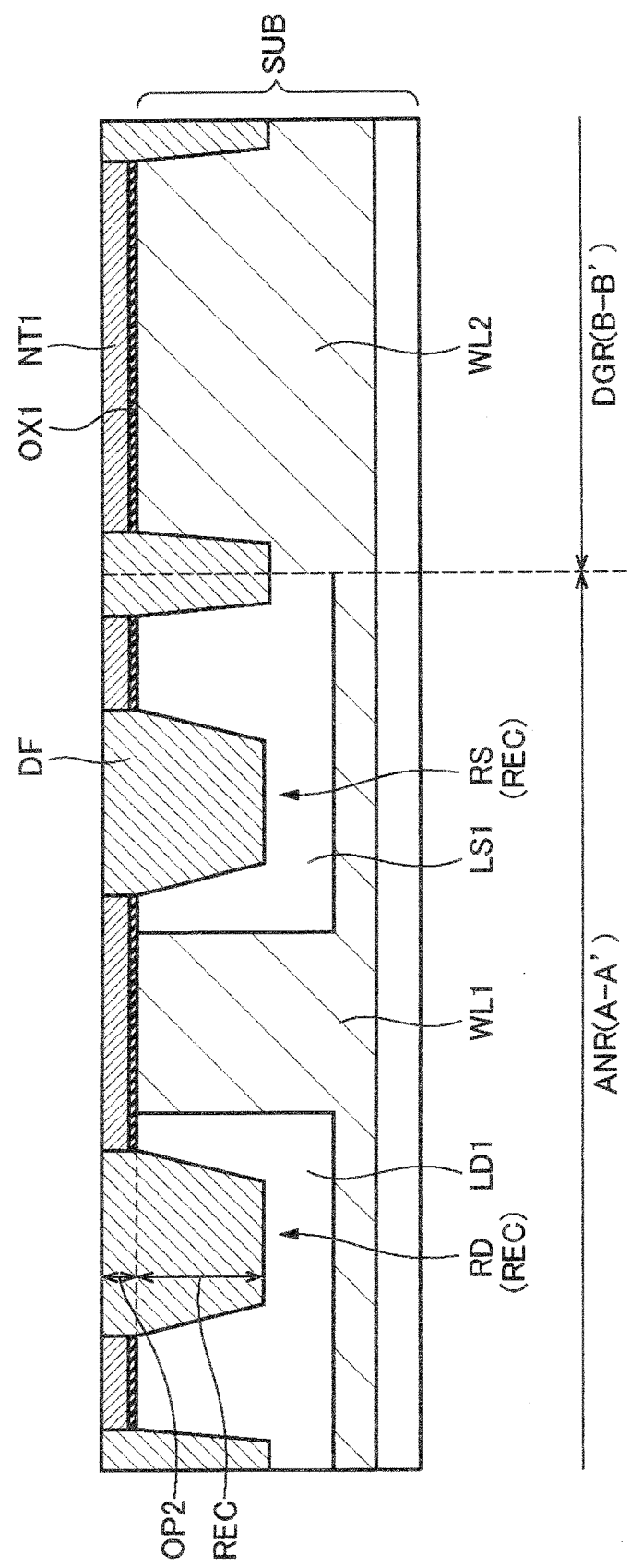
FIG. 32 is a sectional view illustrating the method of manufacturing the semiconductor device illustrated in FIG. 27.

Subsequently, as illustrated in FIG. 32, a surface portion of the insulating film DF is removed. The insulating film DF on the nitride film NT1 is thus removed. The insulating film DF is removed by, for example, chemical mechanical polishing (CMP).

Figure 33:
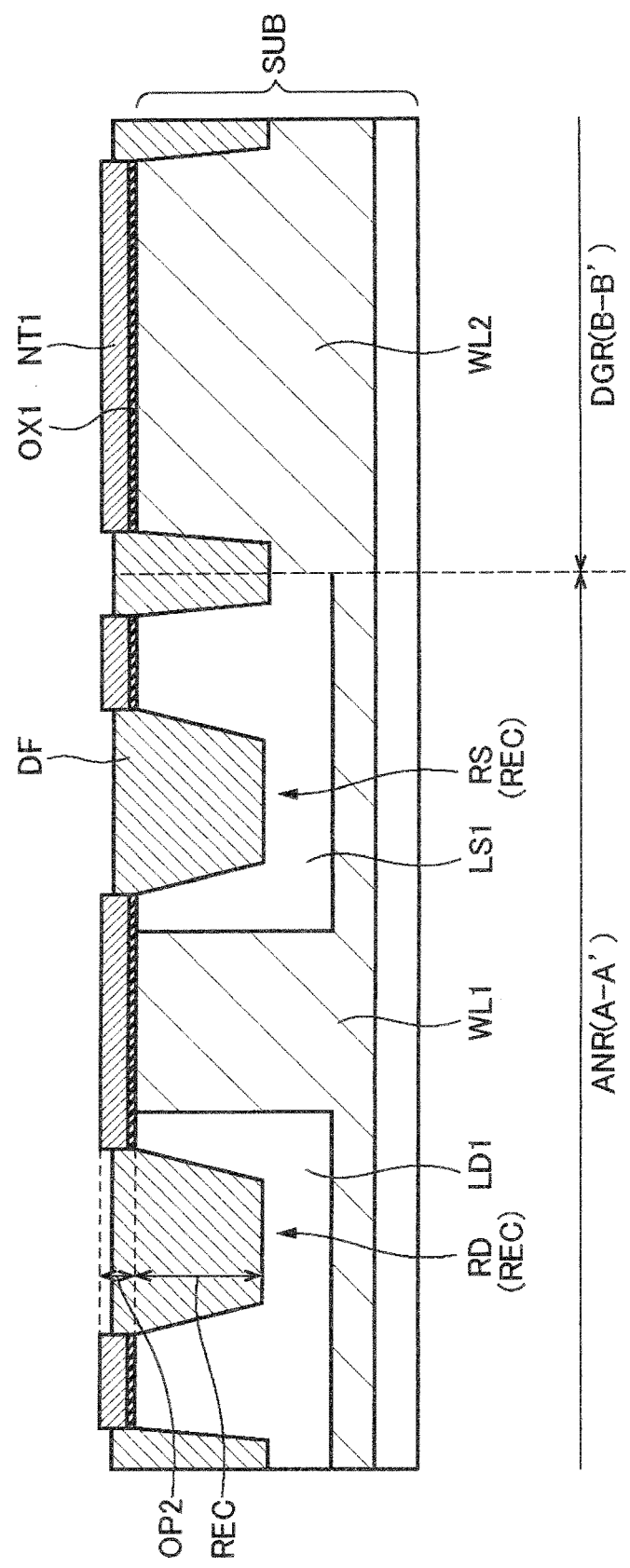
FIG. 33 is a sectional view illustrating the method of manufacturing the semiconductor device illustrated in FIG. 27.

Subsequently, as illustrated in FIG. 33, the surface portion of the insulating film DF is further removed. This allows the top of the insulating film DF to be lower than the top of the nitride film NT1. Furthermore, in the exemplary case illustrated in FIG. 33, the top of the insulating film DF is higher than the surface of the substrate SUB. The insulating film DF is removed by, for example, wet etching.

Figure 34:
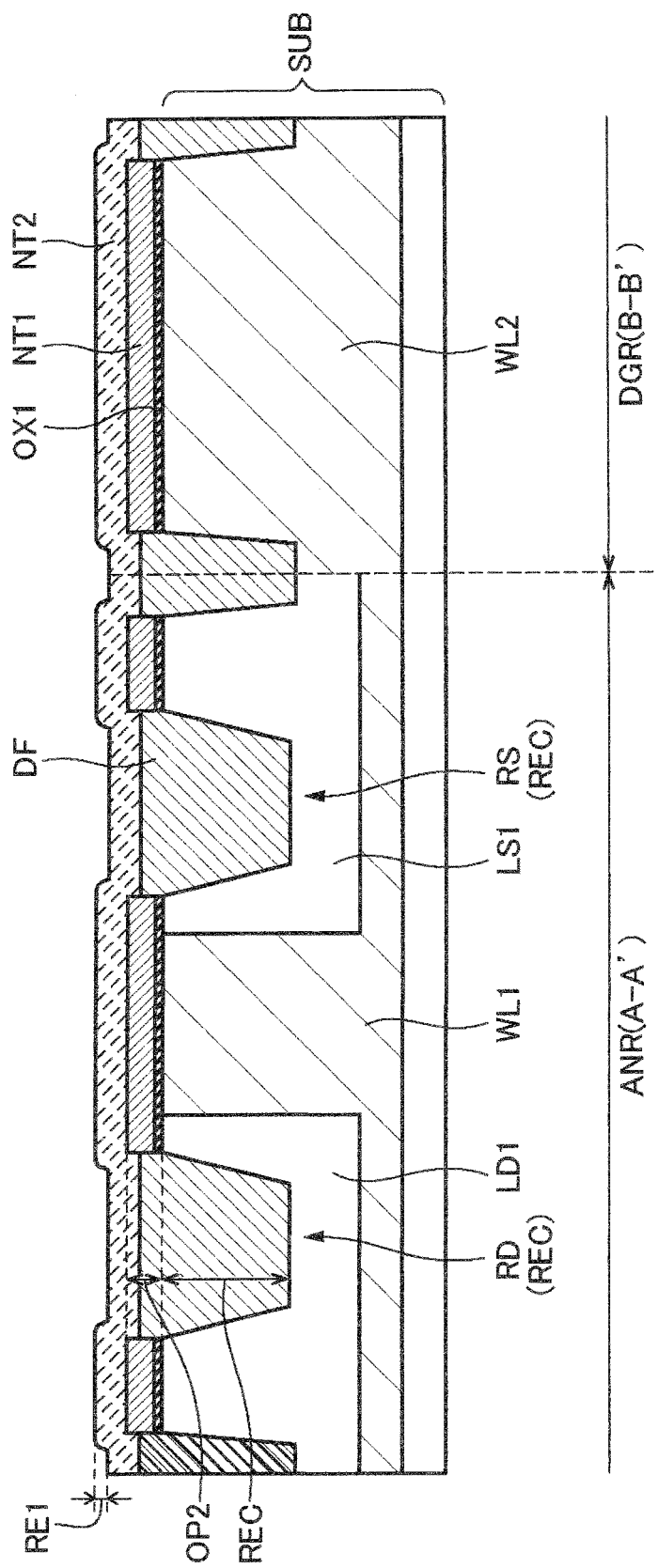
FIG. 34 is a sectional view illustrating the method of manufacturing the semiconductor device illustrated in FIG. 27.

Subsequently, as illustrated in FIG. 34, a nitride film NT2 is formed on the insulating film DF and the nitride film NT1. In this case, as illustrated in FIG. 34, the nitride film NT2 has a recess RE1 in a region overlapping with each recess REC as in the first embodiment (FIG. 11).

Figure 35:
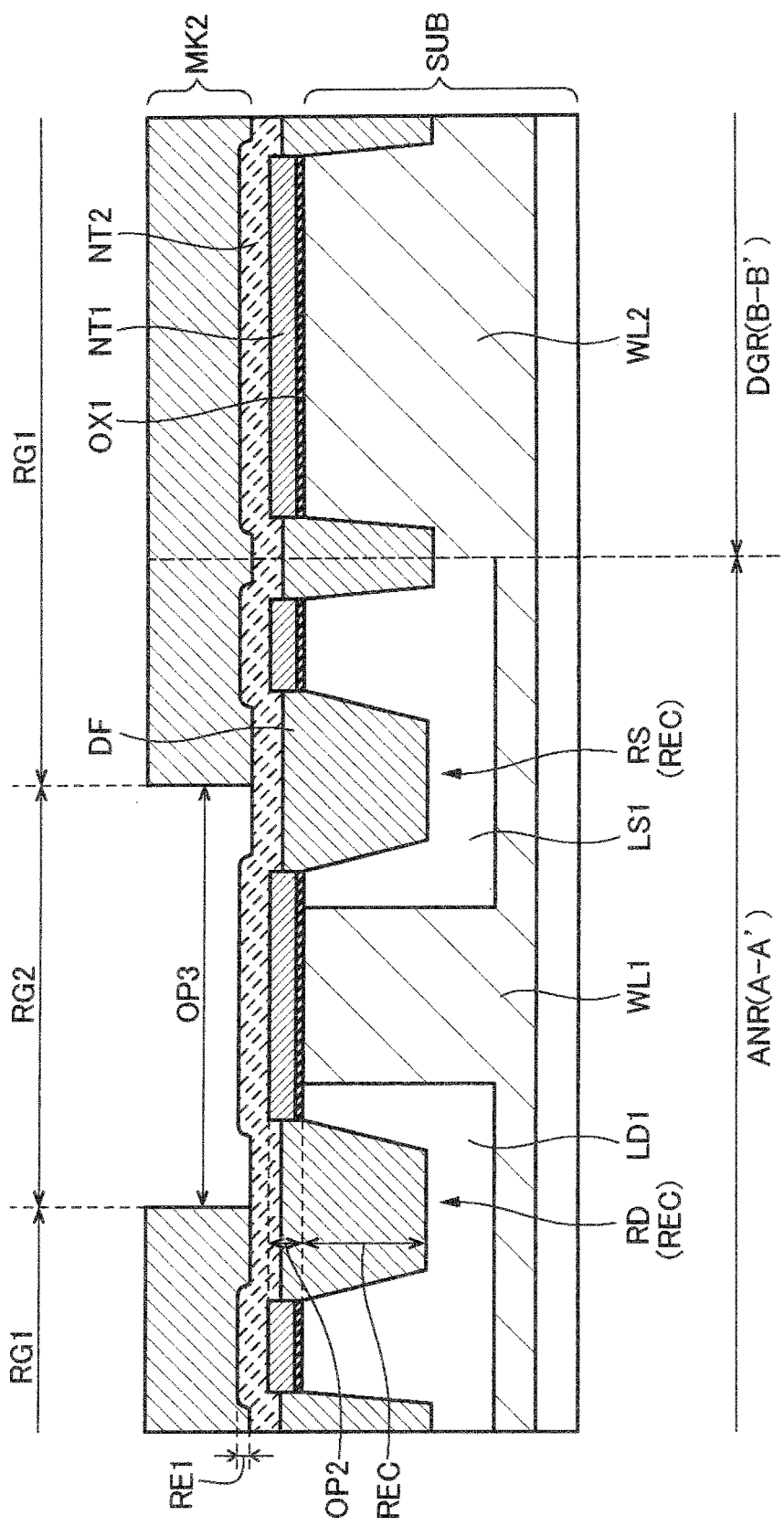
FIG. 35 is a sectional view illustrating the method of manufacturing the semiconductor device illustrated in FIG. 27.

Subsequently, as illustrated in FIG. 35, a mask film MK2 is formed on the nitride film NT2. The mask film MK2 has an opening OP3 in the second region RG2. The second region RG2 is to have the gate insulating film GI1 (FIG. 27) in a later step. The mask film MK2 covers the nitride film NT2 in a region (the first region RG1) other than the second region RG2.

Figure 36:
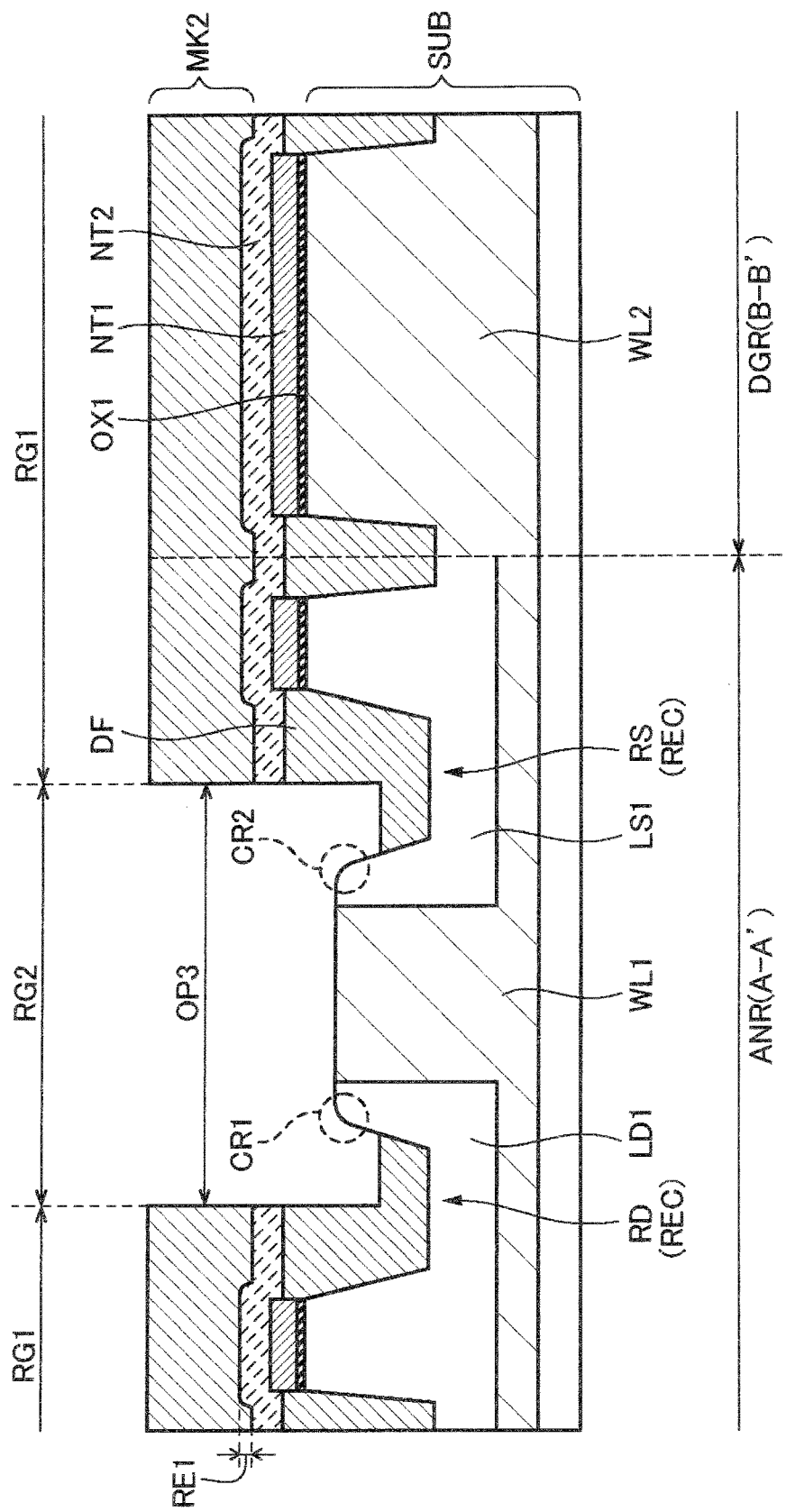
FIG. 36 is a sectional view illustrating the method of manufacturing the semiconductor device illustrated in FIG. 27.

Subsequently, as illustrated in FIG. 36, the nitride film NT2, the nitride film NT1, the oxide film OX1, and the insulating film DF are etched with the mask film MK2 as a mask. The nitride film NT2, the nitride film NT1, and the oxide film OX1 are thus removed from the second region RG2. In addition, the top of insulating film DF is located below the upper end of the recess REC in the second region RG2. In this case, part of the substrate SUB is removed from the second region RG2. In addition, as in the first embodiment (for example, FIG. 13), the angles (angles CR1 and CR2) defined by the inner side faces of the recess REC and the surface of the substrate SUB are each rounded in the second region RG2. Subsequently, the mask film MK2 is removed.

In the step illustrated in FIG. 36, the substrate SUB in the digital region DGR is covered with the nitride film NT2. Hence, the step illustrated in FIG. 36 does not remove the top of the insulating film DF in the digital region DGR. In this way, as illustrated in FIG. 27, the top of the insulating film DF in the digital region DGR is located above the bottom of each of the recess RD1 and the recess RS1.

Figure 37:
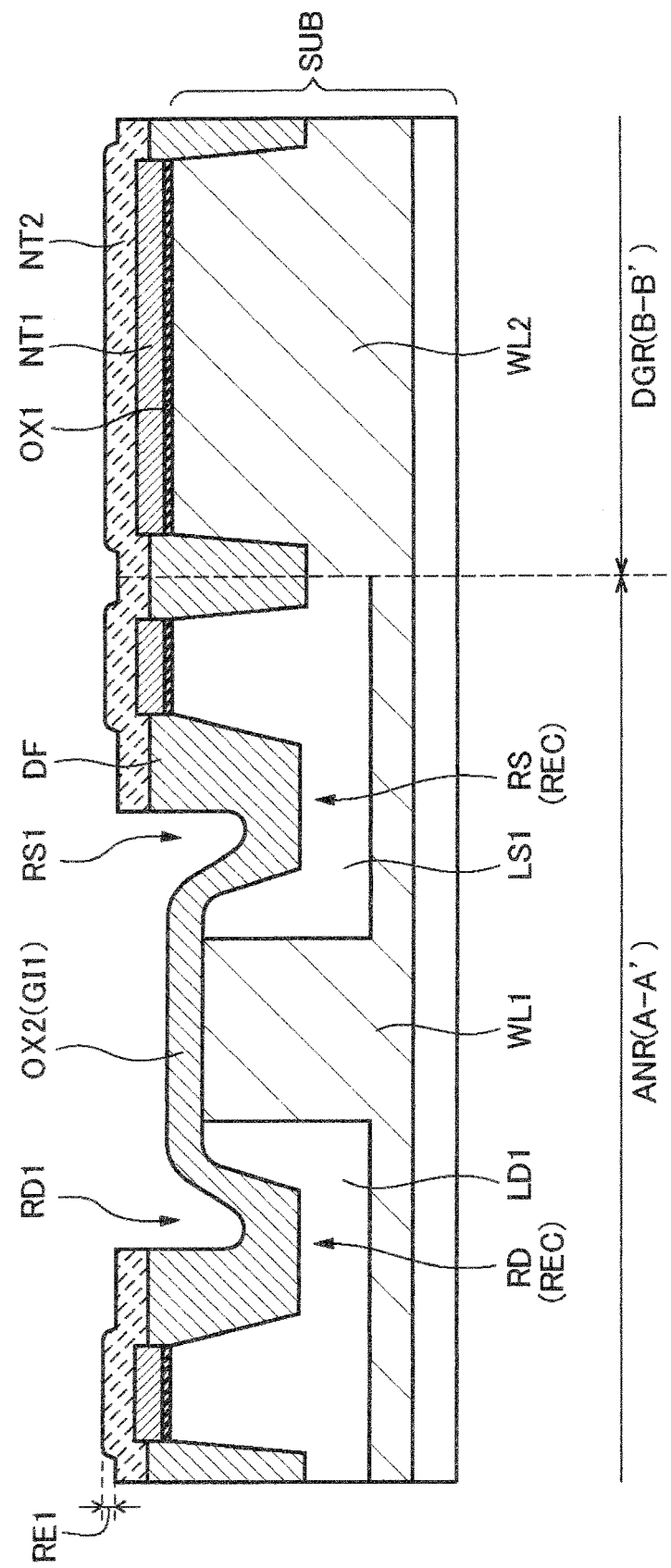
FIG. 37 is a sectional view illustrating the method of manufacturing the semiconductor device illustrated in FIG. 27.

Subsequently, as illustrated in FIG. 37, while the nitride film NT2 is left in the first region RG1, an oxide film OX2 is formed on the substrate SUB in the second region RG2 by thermal oxidation, for example. The oxide film OX2 is to be the gate insulating film GI1. In this case, the recesses RD1 and RS1, each having the oxide film OX2 (a gate insulating film GI2) on its side face, are formed on the insulating film DF in the recesses RD and RS, respectively.

Figure 38:
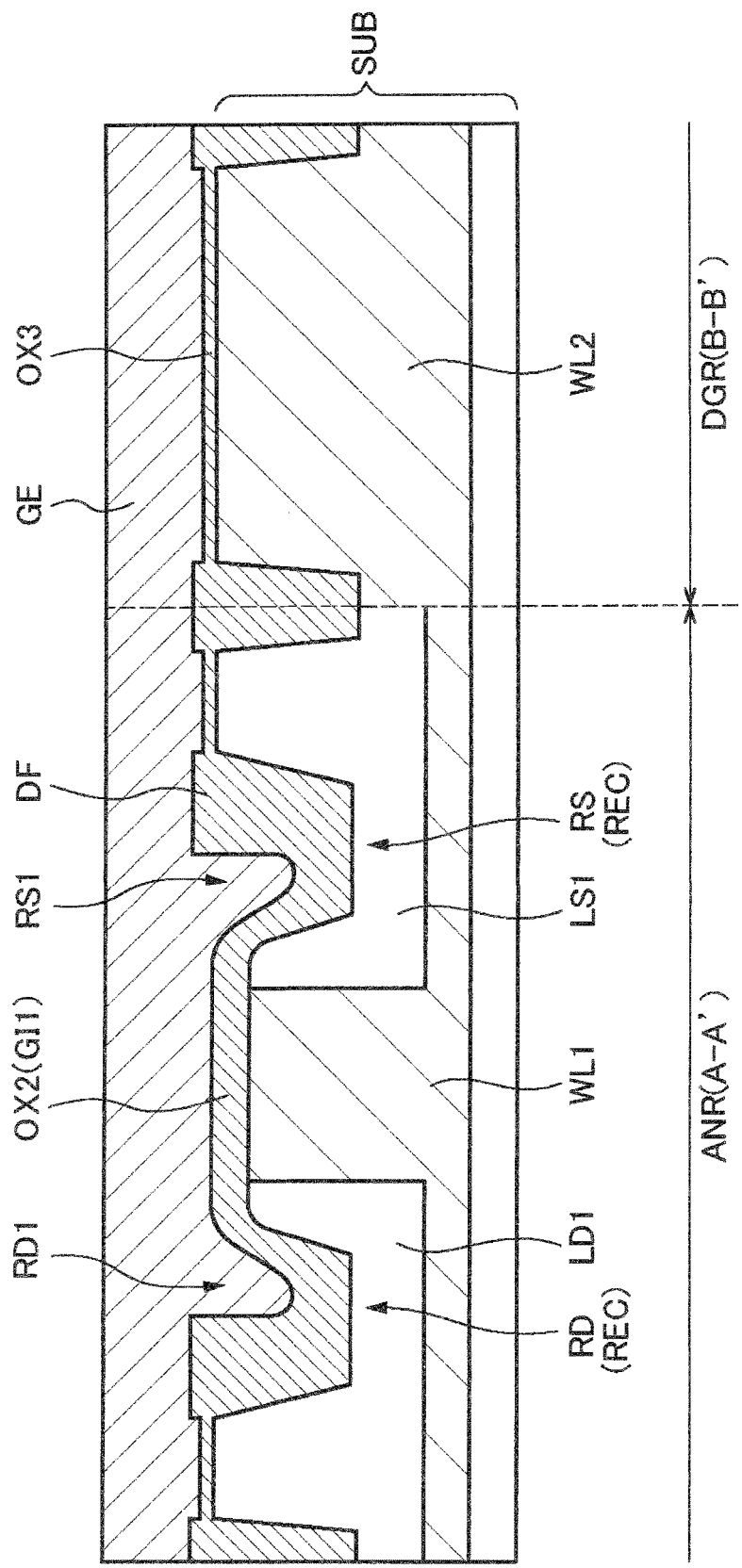
FIG. 38 is a sectional view illustrating the method of manufacturing the semiconductor device illustrated in FIG. 27.

Subsequently, as illustrated in FIG. 38, the nitride film NT2, the nitride film NT1, and the oxide film OX1 are removed. Subsequently, an oxide film OX3 is formed on the substrate SUB by thermal oxidation, for example. The oxide film OX3 is to be the gate insulating film GI2 (FIG. 27). Subsequently, a conductive film GE is formed on the substrate SUB. The conductive film GE, such as a polysilicon film, is to be each of the gate electrodes GE1 and GE2 (FIG. 27).

Figure 39:
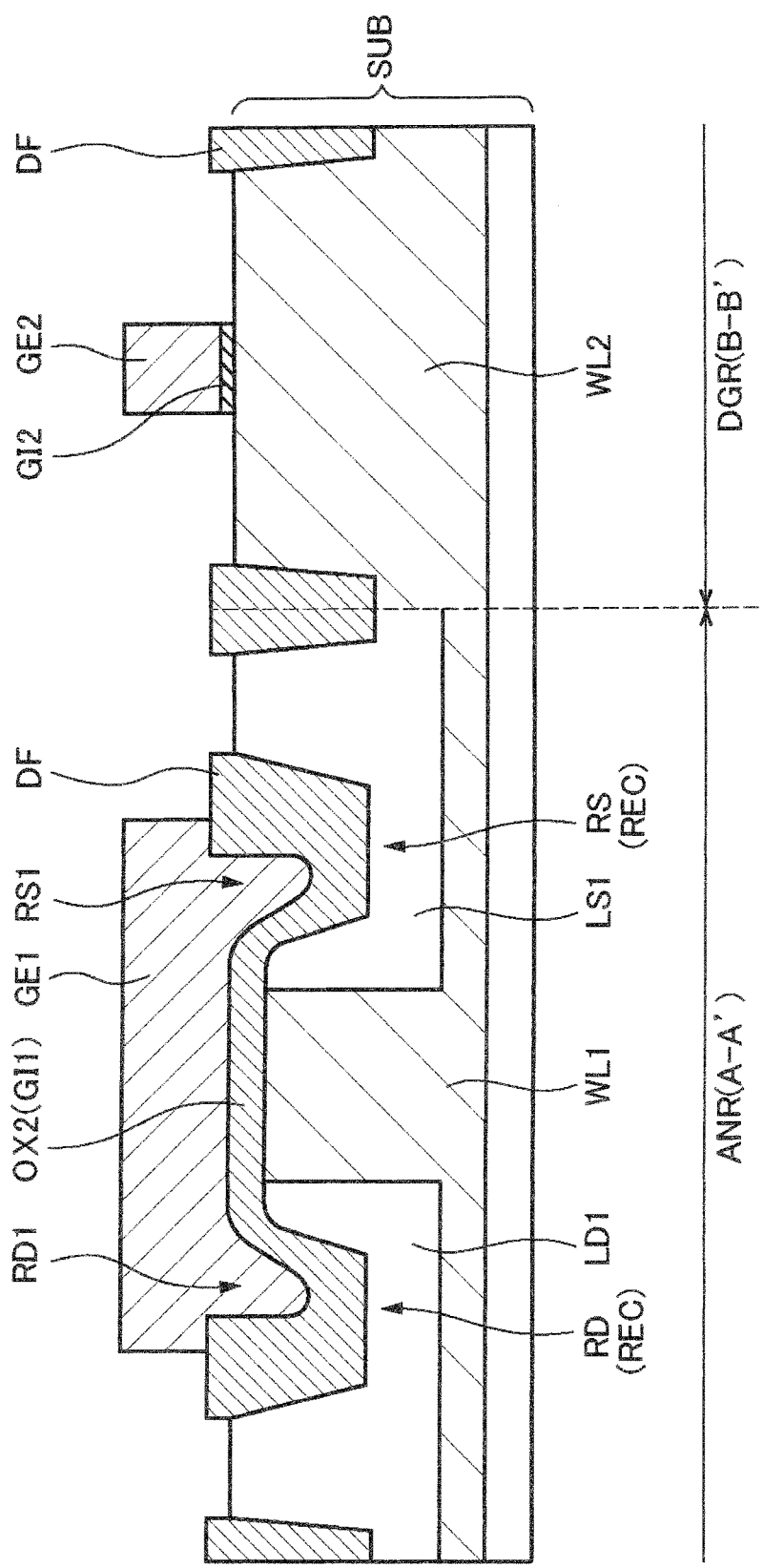
FIG. 39 is a sectional view illustrating the method of manufacturing the semiconductor device illustrated in FIG. 27.

Subsequently, as illustrated in FIG. 39, the conductive film GE and the oxide film OX3 (FIG. 38) are patterned. The gate electrodes GE1 and GE2 and the gate insulating film GI2 are thus formed. Subsequently, the LDD region LD2 and the LDS region LS2 are formed in the digital region DGR. Subsequently, an insulating film that is to be each of the sidewalls SW1 and SW2 is formed on the substrate SUB. Subsequently, the insulating film is etched back. The sidewalls SW1 and SW2 are thus formed. Subsequently, the drain region DR1, the source region SR1, the drain region DR2, and the source region SR2 are formed. Subsequently, the insulating layer IL is formed on the substrate SUB. Subsequently, the contacts CT1 and CT2 are buried in the insulating layer IL. In this way, the semiconductor device illustrated in FIG. 27 is manufactured.

The second embodiment also provides the effects similar to those of the first embodiment.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:

1. A semiconductor device, comprising:
   a substrate;
   a first transistor having a gate insulating film and a gate electrode, and having a drain and a source opposed to each other with the gate insulating film in between in a plan view;
   a first impurity region that is provided in the substrate and is to be one of the drain and the source;
   a first recess that is provided in the substrate and is located between the gate insulating film and the first impurity region;
   a first insulating film filled in the first recess; and
   a second recess provided in the first insulating film on a side close to the gate insulating film,
   wherein a first angle defined by an inner side face of the first recess and a surface of the substrate is rounded on a side of the first recess close to the gate insulating film.

2. The semiconductor device according to claim 1, further comprising:
   a second impurity region that is provided in the substrate and is to be the other of the drain and the source;
   a third recess that is provided in the substrate and is located between the gate insulating film and the second impurity region;
   a second insulating film filled in the third recess; and
   a fourth recess provided in the second insulating film on a side close to the gate insulating film,
   wherein a second angle defined by an inner side face of the third recess and the surface of the substrate is rounded on a side of the third recess close to the gate insulating film.

3. The semiconductor device according to claim 1, further comprising a second transistor having a gate insulating film and a gate electrode, and having a drain and a source opposed to each other with the gate insulating film in between in a plan view,
   wherein the first transistor configures a first circuit having a power supply potential being a first voltage,
   wherein the second transistor configures a second circuit having a power supply potential being a second voltage lower than the first voltage, and
   wherein the gate insulating film of the first transistor is thicker than the gate insulating film of the second transistor.

4. The semiconductor device according to claim 3, further comprising:
   a fifth recess that is provided in the substrate and encloses the second transistor in a plan view; and
   a third insulating film filled in the fifth recess,
   wherein a top of the third insulating film is located above a bottom of the second recess.

* * * * *